(12) United States Patent
Cherala et al.

(10) Patent No.: US 12,740,479 B2
(45) Date of Patent: Sep. 15, 2026

(54) METHOD OF FORMING A DIE STRUCTURE INCLUDING A CONTROLLED THICKNESS LAYER AND AN APPARATUS FOR PERFORMING THE METHOD

(71) Applicant: CANON KABUSHIKI KAISHA, Tokyo (JP)

(72) Inventors: Anshuman Cherala, Austin, TX (US); Mario Johannes Meissl, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 707 days.

(21) Appl. No.: 18/147,858

(22) Filed: Dec. 29, 2022

(65) Prior Publication Data

US 2024/0222351 A1 Jul. 4, 2024

(51) Int. Cl.

| | |
|---|---|
| ***H01L 21/67*** | (2006.01) |
| ***H01L 25/065*** | (2023.01) |
| ***H10P 54/00*** | (2026.01) |
| ***H10P 72/00*** | (2026.01) |
| ***H10P 72/70*** | (2026.01) |
| ***H10W 90/00*** | (2026.01) |
| *H10W 80/00* | (2026.01) |

(52) U.S. Cl.

CPC ............ *H10W 90/00* (2026.01); *H10P 54/00* (2026.01); *H10P 72/0442* (2026.01); *H10P 72/74* (2026.01); *H10W 80/312* (2026.01); *H10W 80/327* (2026.01); *H10W 90/792* (2026.01)

(58) Field of Classification Search

CPC ............... H01L 21/6835; H01L 21/568; H01L 21/6715

See application file for complete search history.

(56) References Cited

U.S. PATENT DOCUMENTS

| | | | |
|---|---|---|---|
| 6,013,534 | A | 1/2000 | Mountain |
| 6,025,638 | A | 2/2000 | Pogge et al. |

(Continued)

FOREIGN PATENT DOCUMENTS

| | | | |
|---|---|---|---|
| WO | 2019126769 | A1 | 6/2019 |
| WO | 2020051410 | A1 | 3/2020 |

(Continued)

*Primary Examiner* — Nicholas J Tobergte
*Assistant Examiner* — David J Goodwin
(74) *Attorney, Agent, or Firm* — Abel Schillinger, LLP

(57) ABSTRACT

A method can include applying a first controlled thickness layer over a first die substrate; attaching a first support substrate to the first controlled thickness layer to form a first sandwich structure; and singulating the first sandwich structure to form a plurality of first die structures, including a particular first die structure. The method can include attaching the particular first die structure to a transfer substrate, wherein the transfer substrate includes a particular second die structure that includes a particular second die. The particular second die has an average thickness different as compared to a particular first die within the particular first die structure. The method includes bonding the particular first die structure to a particular third die. After bonding, the upper surfaces of the particular first and second die structures are within a tolerance of being coplanar. An apparatus can be designed to carry out the method.

21 Claims, 11 Drawing Sheets

(56) References Cited

U.S. PATENT DOCUMENTS

| | | | |
|---|---|---|---|
| 6,333,553 B1 | 12/2001 | Pogge | |
| 7,005,319 B1 | 2/2006 | Chen et al. | |
| 10,186,447 B2 | 1/2019 | Ekkels et al. | |
| 2003/0012868 A1* | 1/2003 | Davlin | H01L 21/6715 427/58 |
| 2013/0143413 A1* | 6/2013 | Sekiya | H01L 21/31058 438/759 |
| 2017/0018450 A1* | 1/2017 | Tang | C25D 17/06 |
| 2019/0267306 A1* | 8/2019 | Raravikar | H01L 23/42 |
| 2020/0161230 A1 | 5/2020 | Knickerbocker et al. | |
| 2020/0357641 A1 | 11/2020 | Delacruz et al. | |
| 2021/0134640 A1 | 5/2021 | Sreenivasan et al. | |
| 2021/0195816 A1 | 6/2021 | Bilewicz et al. | |
| 2023/0245996 A1 | 8/2023 | Sreenivasan | |
| 2024/0113088 A1* | 4/2024 | Karhade | H01L 24/19 |

FOREIGN PATENT DOCUMENTS

| | | |
|---|---|---|
| WO | 2022212260 A1 | 10/2022 |
| WO | 2023056068 A1 | 4/2023 |
| WO | 2023056072 A1 | 4/2023 |

* cited by examiner 4222
422
4224

532
528
4224
526
534
524
4222
522
422
112

528
624
532
526
112
524
4224
534
522
422

720
532
726
112
624
534
422

820
726
112
822
624
820
122
422

920
926
922
114
920
924
920
124

METHOD OF FORMING A DIE STRUCTURE INCLUDING A CONTROLLED THICKNESS LAYER AND AN APPARATUS FOR PERFORMING THE METHOD

FIELD OF THE DISCLOSURE

The present disclosure relates to methods of forming die structures including controlled thickness layers and apparatuses for performing the methods.

RELATED ART

Advanced packaging technologies demand precise and accurate thickness control and placement of dies. Different thicknesses of dies may need to be bonded to an underlying die. The thickness difference between the dies may make the bonding operation difficult if not impossible. A bonding head can contact the thicker die before the thinner die. As downforce pressure is increased, the thicker die or the underlying die may become damaged before the thinner die contacts the bonding head. Even if the bonding head can contact the thinner die before the thicker die or underlying die is damaged, the downforce pressure exerted by the bonding head onto the thinner die may be insufficient to bond properly the thinner die to the underlying die. A need exists for bonding dies having different thicknesses to another die.

SUMMARY

In an aspect, an apparatus can include a first die substrate chuck for holding a first die substrate including a plurality of first dies, wherein the plurality of first dies has a nonuniform thickness; a dispense module configured to supply first thickness layer onto the first die substrate to compensate for the nonuniform thickness of the plurality of first dies; and a first support substrate chuck for attaching a first support substrate to the first thickness layer to form a first sandwich structure that includes the first die substrate, the first thickness layer, and the first support substrate.

In an embodiment, the apparatus can further include a substrate receiver and a substrate transfer tool configured for transferring a first die structure of the first sandwich structure to the substrate receiver.

In a particular embodiment, the substrate transfer tool is a substrate transfer chuck for holding a transfer substrate.

In another embodiment, the apparatus can further include a second die substrate chuck for holding a second die substrate including a plurality of second dies, wherein the plurality of second dies has a lesser average thickness as compared to the plurality of first dies; and a second support substrate chuck for holding a second support substrate. The dispense module can be further configured to supply a second thickness layer onto the second die substrate so that an average thickness of the second thickness layer is greater than an average thickness of the first thickness layer. The second support substrate chuck can be configured to attach the second support substrate to the second thickness layer to form a second sandwich structure that includes the second die substrate, the second thickness layer, and the second support substrate.

In a particular embodiment, the apparatus can further include a controller configured to determine an amount of the first thickness layer to supply based at least in part on a thickness of the first die substrate, a thickness of the first support substrate, and a thickness of the second sandwich structure; and transmit a signal to the dispense module to supply the amount of the first thickness layer.

In a more particular embodiment, the dispense module is configured to supply the first thickness layer at a greater areal density at a first location of the first die substrate where the first die substrate is relatively thinner and at a lower areal density at a second location of the first die substrate where the first die substrate is relatively thicker.

In another aspect, an apparatus can include a die substrate chuck for holding a die substrate including a plurality of dies; a dispense module configured to supply a thickness layer onto the die substrate; and a support substrate chuck for attaching a support substrate to the thickness layer to form a sandwich structure that includes the die substrate, the thickness layer, and the support substrate. The dispense module can supply first thickness layer onto a first die substrate including a plurality of first dies, the support substrate chuck attaches a first support substrate to the first thickness layer to form a first sandwich structure that includes the first die substrate, the first thickness layer, and the first support substrate. The die substrate chuck can hold a second die substrate including a plurality of second dies. The plurality of second dies can have a lesser average thickness as compared to the plurality of first dies. The dispense module can supply a second thickness layer onto the second die substrate so that an average thickness of the second thickness layer is greater than an average thickness of the first thickness layer. The support substrate chuck can attach a second support substrate to the second thickness layer to form a second sandwich structure that includes the second die substrate, the second thickness layer, and the second support substrate.

In a further aspect, a method can include applying a first thickness layer over a first die substrate that includes a plurality of first dies; attaching a first support substrate to the first thickness layer to form a first sandwich structure that includes the first die substrate, the first thickness layer, and the first support substrate; singulating the first sandwich structure to form a plurality of first die structures, including a particular first die structure that includes a particular first die; attaching the particular first die structure to a transfer substrate, wherein the transfer substrate includes a particular second die structure, the particular second die structure includes a particular second die, and the particular second die has an average thickness different as compared to a particular first die within the particular first die structure; and bonding the particular first die structure to a particular third die. Each of the particular first die structure and the particular second die structure can have a proximal surface and a distal surface opposite the proximal surface, wherein the proximal surface is disposed between the particular third die and the distal surface. After bonding, the distal surface of the particular first die structure and the distal surface of the particular second die structure can be within a tolerance of being coplanar.

In an embodiment, after bonding, the distal surface of the particular first die structure lies along a first plane, the distal surface of the particular second die structure lies along a second plane, and the first plane is parallel to the second plane, or the first plane intersects the second plane at an acute angle of at most 1 milliradian.

In another embodiment, after bonding, the distal surface of the particular first die structure lies at a first average elevation above the particular third die, the distal surface of the particular second die structure lies at a second average elevation above the particular third die, and the first average elevation is within 1 micron of the second average elevation.

In still another embodiment, attaching the first support substrate to the first thickness layer includes curing the first thickness layer.

In a particular embodiment, curing the first thickness layer includes transmitting actinic radiation through the first support substrate.

In still another embodiment, the method can further include (1) inverting the transfer substrate before bonding; or (2) inverting a third die substrate before bonding, wherein the third die substrate is associated with the particular third die.

In a further embodiment, the method can further include applying a second thickness layer over a second die substrate that includes a plurality of second dies; attaching a second support substrate to the second thickness layer to form a second sandwich structure that includes the second die substrate, the second thickness layer, and the plurality of second dies; singulating the second sandwich structure to form a plurality of second die structures, including the particular second die structure; and attaching the particular second die structure to the transfer substrate.

In a particular embodiment, the particular first die is thinner as compared to the particular second die, and the first support substrate is thicker as compared to the second support substrate.

In another embodiment, a third die substrate includes a plurality of third dies, including the particular third die, wherein the plurality of third dies is part of or attached to the third die substrate.

In a particular embodiment, the third die substrate includes a set of third dies, including the particular third die, that are known good dies, wherein the set of third dies has a same number of or fewer dies as compared to the plurality of third dies.

In a more particular embodiment, the plurality of first dies includes a set of first dies that are known good first dies bonded to the set of third dies, the plurality of second dies includes a set of second dies that are known good second dies bonded to the set of third dies, and the set of first dies, the set of second dies, and a set of third dies have a same number of dies.

In a further embodiment, after bonding, the method can further include, for the particular first die structure, removing the first thickness layer and the first support substrate from the particular first die; and, for the particular second die structure, removing a second thickness layer and a second support substrate from the particular second die.

In another aspect, a method can include applying a first thickness layer over a first die substrate including a plurality of first dies; attaching a first support substrate to the first thickness layer to form a first sandwich structure that includes the first die substrate, the first thickness layer, and the first support substrate; applying a second thickness layer over a second die substrate including a plurality of second dies so that an average thickness of the second thickness layer is greater than an average thickness of the first thickness layer, and wherein the plurality of second dies has a lesser average thickness as compared to the plurality of first dies.

In a further aspect, an electronic device can include a first die structure including a first die, a first thickness layer, and a first support substrate, wherein the first die structure has a proximal surface and a distal surface opposite the proximal surface; a second die structure including a second die, a second thickness layer, and a second support substrate, wherein the second die structure has a proximal surface and a distal surface opposite the proximal surface; and a third die. The proximal surfaces of the first die structure and the second die structure are bonded to the third die. The plurality of second dies has a lesser average thickness as compared to the plurality of first dies, and an average thickness of the second thickness layer is greater than an average thickness of the first thickness layer.

BRIEF DESCRIPTION OF THE DRAWINGS

Implementations are illustrated by way of example and are not limited in the accompanying figures.

Skilled artisans appreciate that elements in the figures are illustrated for simplicity and clarity and have not necessarily been drawn to scale. For example, the dimensions of some of the elements in the figures can be exaggerated relative to other elements to help improve understanding of implementations of the invention.

DETAILED DESCRIPTION

The following description in combination with the figures is provided to assist in understanding the teachings disclosed herein. The following discussion will focus on specific implementations and implementations of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and can be found in textbooks and other sources within the arts.

A support substrate can be used to aid in handling a thin die where the thickness of the thin die causes the thin die to be difficult or impossible to handle. A controlled thickness layer can be used between the thin die and the support substrate to compensate for a nonuniform thickness of a die substrate when forming a die structure that includes a portion of the support substrate and the thin die. The controlled thickness layer can also help in controlling the thickness of the die structure. During a bonding operation, upper surfaces of die structures or upper surfaces of a combination of die structures and relative thick dies are ideally coplanar during a bonding operation. The controlled thickness layer can have a thickness that can adjust for differences in die thicknesses, differences in support substrate thicknesses, or differences in die thicknesses and support substrate thicknesses. By controlling the thickness of the controlled thickness layer, a bonding head can apply force more uniformly and reduce the likelihood of a die or a die structure not properly bonding or become damaged during a bonding operation.

Figure 1:
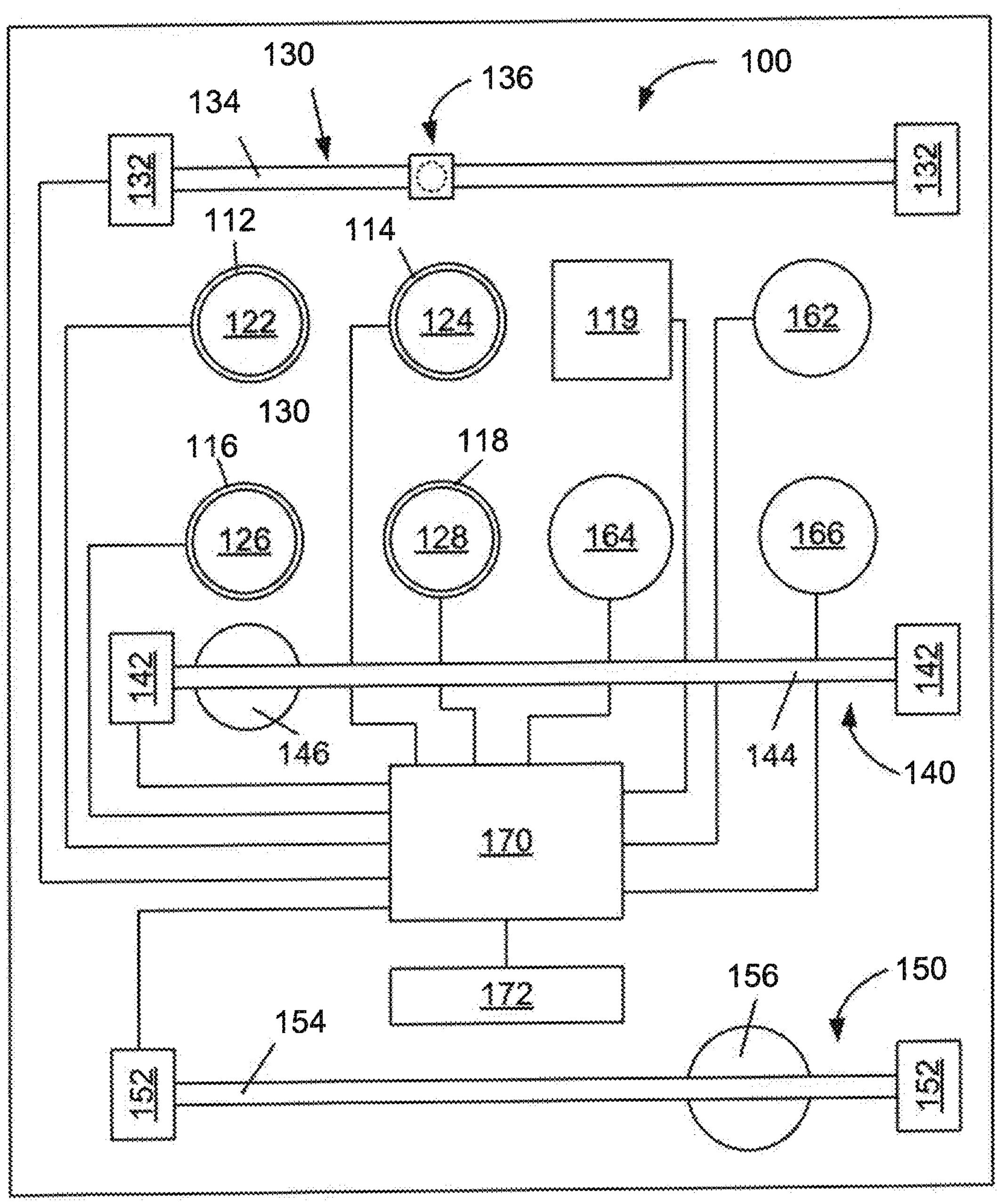
FIG. 1 includes a conceptual view of an apparatus that can be used in bonding dies having different types of die.

FIG. 1 includes a conceptual diagram of a top view of an apparatus 100 that can be used to bond dies having different thicknesses to a further die. In an embodiment, hybrid bonding can be used to bond the dies to the further die. Other methods of bonding, such as fusion bonding or the like, of wafers, die, or a combination of wafers and die together that are well known in the art may also be used instead of hybrid bonding. The apparatus 100 includes a source substrate chuck 112, a source substrate chuck 114, a transfer substrate chuck 116, and a destination substrate chuck 118, a support substrate pod 119, a controlled thickness material dispense module 130, a die transfer tool 140, a substrate transfer tool 150, a singulation tool 162, a bonding head 164, an annealing station 166, a controller 170, and a memory 172.

Although not part of the apparatus, portions of the description below are easier to understand by identifying particular die substrates associated with particular substrate chucks. A source substrate 122 is coupled to the source substrate chuck 112, another source substrate 124 is coupled to the source substrate chuck 114, a transfer substrate 126 is coupled to the transfer substrate chuck 116, and a destination substrate 128 is coupled to the destination substrate chuck 118. In an embodiment, the source substrate 122 overlies the source substrate chuck 112, the source substrate 124 overlies the source substrate chuck 114, the transfer substrate 126 overlies the transfer substrate chuck 116, and the destination substrate 128 overlies the destination substrate chuck 118. The source substrate chuck 112, the source substrate chuck 114, the transfer substrate chuck 116, and the destination substrate chuck 118 can be die substrate chucks that can be used with die substrates.

Each of the substrate chucks 112, 114, 116, and 118 can be a vacuum chuck, pin-type chuck, a groove-type chuck, an electrostatic chuck, an electromagnetic chuck, or the like. The substrate chucks 112, 114, 116, and 118 may be the same type, for example, vacuum chucks, or different types. For example, one of the substrate chucks 112, 114, 116, and 118 can be a vacuum chuck, and another one of the substrate chucks can be an electrostatic chuck. A stage (not illustrated) can be coupled to the substrate chucks 112, 114, 116, or 118 and be used to move the substrate chuck within the apparatus 100. Different stages can be coupled to different substrate chucks or a combination of such substrate chucks can be coupled to the same stage.

The support substrate pod 119 can hold a plurality of support substrates. The support substrates can be used to form die structures having sufficient thickness so that the die transfer tool 140 can handle properly the die structures that include dies. Without the support substrates, the dies may be too thin for the die transfer tool 140 to handle.

The substrate chucks 112, 114, 116, and 118 and the support substrate pod 119 are examples of substrate receivers. A substrate receiver can be an object that receives a substrate and can include a substrate chuck, a substrate pod (container), a substrate cassette, or the like.

The controlled thickness material dispense module 130 is configured to supply a material that forms a controlled thickness layer over either or both of the source substrates 122 and 124. The controlled thickness material dispense module 130 can be a gantry-based system that includes ends 132 that are coupled to rails (not illustrated) and allow the controlled thickness material dispense module 130 to move in a direction corresponding to the top and bottom of FIG. 1. The controlled thickness material dispense module 130 includes a bridge 134 that is coupled to the ends 132 and can pass over the substrate chucks 112, 114, 116, and 118. A dispense head 136 is coupled to and configured to move along the bridge 134 between the left-hand side and the right-hand side of FIG. 1. The dispense head 136 can include one or more nozzles that dispense the material for the controlled thickness layer. The dashed lines within the dispense head 136 are used to indicate that the material is supplied along the bottom side of the dispense head 136. An alternative embodiment may include substrate stages that allow one or more substrate chucks 112, 114, 116 and 118 to move relative to the dispense head 136 in addition to or as a replacement of the bridge 134.

The die transfer tool 140 is configured to move dies or die structures to or from any of the substrate chucks 112, 114, 116, and 118, the singulation tool 162, or the annealing station 166. The die transfer tool 140 is configured to move one die, one die structure, or one substrate at a time or move a plurality of dies or die structures at the same time. The die transfer tool 140 may also be configured to move the bonding head 164 over any of the substrate chucks 112, 114, 116, and 118.

The die transfer tool 140 can be a gantry-based system that includes ends 142 that are coupled to rails (not illustrated) and allow the die transfer tool 140 to move in a direction corresponding to the top and bottom of FIG. 1. The die transfer tool 140 includes a bridge 144 that is coupled to the ends 142 and can pass over any subset or all of the substrate chucks 112, 114, 116, and 118, the singulation tool 162, the bonding head 164, the annealing station 166, the controller 170, and the memory 172.

A die transfer head 146 of the die transfer tool 140 is coupled to and configured to move along the bridge 144 between the left-hand side and the right-hand side of FIG. 1. In an embodiment, the die transfer head 146 can include an array of pick-up heads along the bottom surface of the die transfer head 146, and thus, for simplicity, the array of pick-up heads are not illustrated in FIG. 1. An alternative embodiment may include substrate stages that allow one or more substrate chucks 112, 114, 116 and 118 to move relative to the die transfer tool in addition to or as a replacement of the bridge 144.

The array of pick-up heads can be configured as a vector (a row or a column of pick-up heads) or as a matrix (at least two rows and at least two columns of pick-up heads). Regarding the matrix, the number of pick-up heads within the array of pick-up heads may be different between rows, between columns, or between rows and columns. Some array configurations can be 3×1, 6×1, 2×2, 2×3, 2×4, 4×2, 10×10, or another rectangular shape, where the first number corresponds to the number of pick-up heads along a row or column, and the second number corresponds to the number of pick-up heads along the other of the row or column. In theory, all dies or all die structures to be transferred from a source substrate to a transfer substrate may be transferred all at once. For such a configuration, the array of pick-up heads will have fewer pick-up heads along rows closer to the top and bottom of the array as compared to the row or the pair of rows closest to the center of the array, and the array of pick-up heads will have fewer pick-up heads along columns closer to the left side and right side of the array as compared to the column or the pair of columns closest to the center of the array. After reading this specification, skilled artisans will be able to determine an array configuration for the array of pick-up heads that meets the needs or desires for a particular application.

The array of pick-up heads can be configured to have an adjustable pitch that can be reversibly changed between a source-matching pitch for a source substrate and a transfer-matching pitch for a transfer substrate. The array of pick-up heads can include motors, electrical components or the like that can be activated to move pick-up heads to achieve a desired pitch. As used herein, a pitch is the sum of a width or a length of a feature and the space between the feature and the immediately adjacent feature. The features can be dies or die structures at a source substrate, pick-up heads within the array of pick-up heads, or transfer sites of the transfer substrate. The pitch along the X-direction may be the same or different from the pitch in the Y-direction.

In an embodiment, the array of pick-up heads can be at a particular source-matching pitch when picking up a set of dies or die structures from the source substrate 122 coupled to the source substrate chuck 112, at a particular transfer-matching pitch when transferring the set of dies or die structures to the transfer substrate 126. After the set of dies or die structures are transferred to the transfer substrate 126, the pitch for the array of pick-up heads can be changed to another source-matching pitch before picking up dies or die structures from the source substrate 124. After picking up the dies or die structures from the source substrate 124, the pitch for the array of pick-up heads can be changed to another transfer-matching pitch before placing the dies or die structures from the source substrate 124 onto the transfer substrate 126. The transfer-matching pitches when transferring the dies from the source substrate 122 to the transfer substrate 126 and from the source substrate 124 to the transfer substrate 126 may be the same or different.

The substrate transfer tool 150 is configured to move substrates to or from any of the substrate chucks 112, 114, 116, and 118, the support substrate pod 119, the singulation tool 162, or the annealing station 166. The substrate transfer tool 150 may also be configured to move the bonding head 164 over any of the substrate chucks 112, 114, 116, and 118.

The substrate transfer tool 150 can be a gantry-based system that includes ends 152 that are coupled to rails (not illustrated) and allow the substrate transfer tool 150 to move in a direction corresponding to the top and bottom of FIG. 1. The substrate transfer tool 150 includes a bridge 154 that is coupled to the ends 152 and can pass over any subset or all of the substrate chucks 112, 114, 116, and 118, the singulation tool 162, the bonding head 164, the annealing station 166, the controller 170, and the memory 172. A substrate transfer head 156 of the substrate transfer tool 150 is coupled to and configured to move along the bridge 154 between the left-hand side and the right-hand side of FIG. 1. In an embodiment, the substrate transfer head 156 may also be configured to tilt, rotate, invert (flip over) a substrate. The substrate transfer tool may be or include one or more components of an Equipment Front End Module (EFEM). The components of the EFEM may include: a robot arm; a robot hand adapted for holding wafers; sensors; etc.

The singulation tool 162 can be configured to singulate a die substrate into dies or die structures that include the dies. The singulation tool 162 can include a saw, a laser, a water jet, or the like that can cut through the thickness of the substrate being singulated. Depending on the configuration of the singulation tool 162, singulation can generate particles or cause water to be sprayed after hitting the substrate. Thus, the singulation tool 162 can be a separate station within the apparatus 100 or may be external to the apparatus. When within the apparatus 100, the singulation tool 162 can include an enclosure so that particles or water when singulating one of the substrates do not reach any of the other substrates or the substrate chucks within the apparatus 100. In another embodiment, the singulation tool 162 can be in the form of a head that is positioned over a substrate to be singulated. Any of the previously described cutting tools can be used when the singulation tool 162 is in the form of a head. An enclosure or other similar structure may be used to reduce the likelihood that particles or water will reach another substrate or substrate chuck.

The bonding head 164 can be configured to perform a bonding operation of a hybrid bonding process sequence. In an alternative embodiment, other types of bonding operations, such as a fusion bonding operation or the like, may be performed to join dies together. For a bonding operation, the bonding head 164 can be moved over dies or die structures that are to be bonded to other dies and provide sufficient pressure to bond the dies or die structures to the other dies. In an embodiment, dies or die structures associated with the transfer substrate 126 may be bonded to dies on the destination substrate 128 by flipping over the transfer substrate 126 onto the destination substrate 128, properly positioning the dies or die structures of the transfer substrate 126 to the destination bonding sites of the destination substrate 128, moving the bonding head 164 over the transfer substrate 126, and applying sufficient pressure to bond the dies or die structures to the underlying dies. Other options regarding bonding are described in more detail later in this specification.

The annealing station 166 can be configured to perform an anneal operation of a hybrid bonding process sequence. After performing the bonding operation, bonded dies or bonded die structures and dies can be moved to the annealing station 166 where heat can be used to expand metal within interconnects, thru-substrate vias (TSVs), or the like, so that metal from the bonded dies or bonded die structures and die contact each other. A further anneal can be performed to reduce contact resistance. The annealing station 166 can be a separate station within the apparatus 100 or outside the apparatus. In another embodiment, heat may be supplied by a substrate chuck, the bonding head 164, or both, and thus, a separate annealing station 166 is not required in all embodiments. Other details regarding annealing are described in more detail later in this specification.

The apparatus 100 can be controlled using a controller 170 in communication with any or all of the components of the apparatus 100 that have been previously described and potentially other components within the apparatus 100 or external to the apparatus 100. The controller 170 can operate using a computer readable program, optionally stored in memory 172. The controller 170 can include a processor (for example, a central processing unit of a microprocessor or microcontroller), a field-programmable gate array (FPGA), an application specific integrated circuit (ASIC), or the like. The controller 170 can be within the apparatus 100. In another implementation (not illustrated), the controller 170 can be at least part of a computer external to the apparatus 100, where such computer is bidirectionally coupled to the apparatus 100. The memory 172 can include a non-transitory computer readable medium that includes instructions to carry out the actions associated with or between transfer operations. In another embodiment, any or all of the components can include a local controller that provides some of the functionality that would otherwise be provided by the controller 170.

Figure 2:
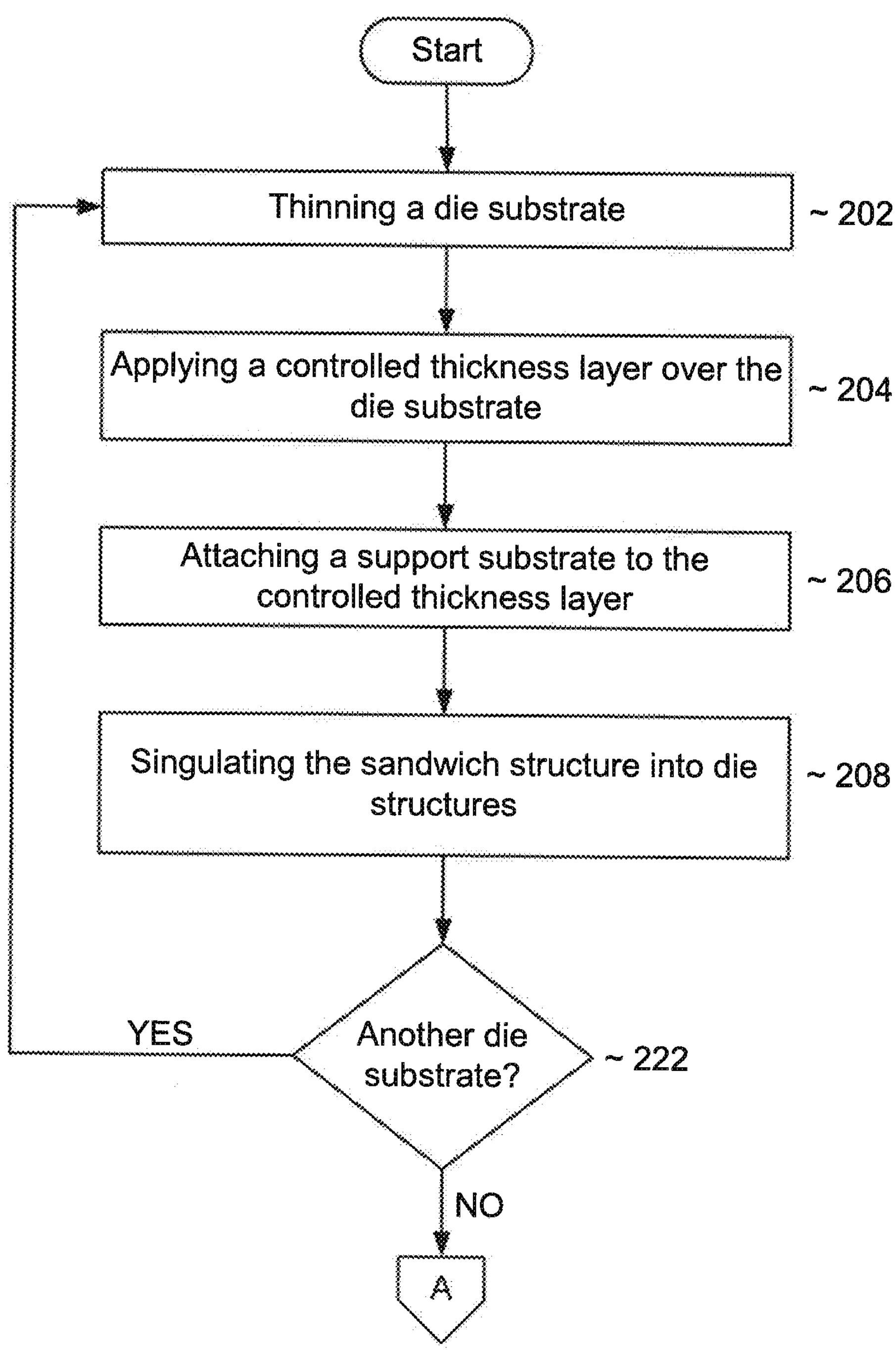
FIGS. 2 and 3 include a process flow diagram for a method of transferring and bonding dies from source substrates to destination bonding sites of dies associated with a destination substrate.
Figure 3:
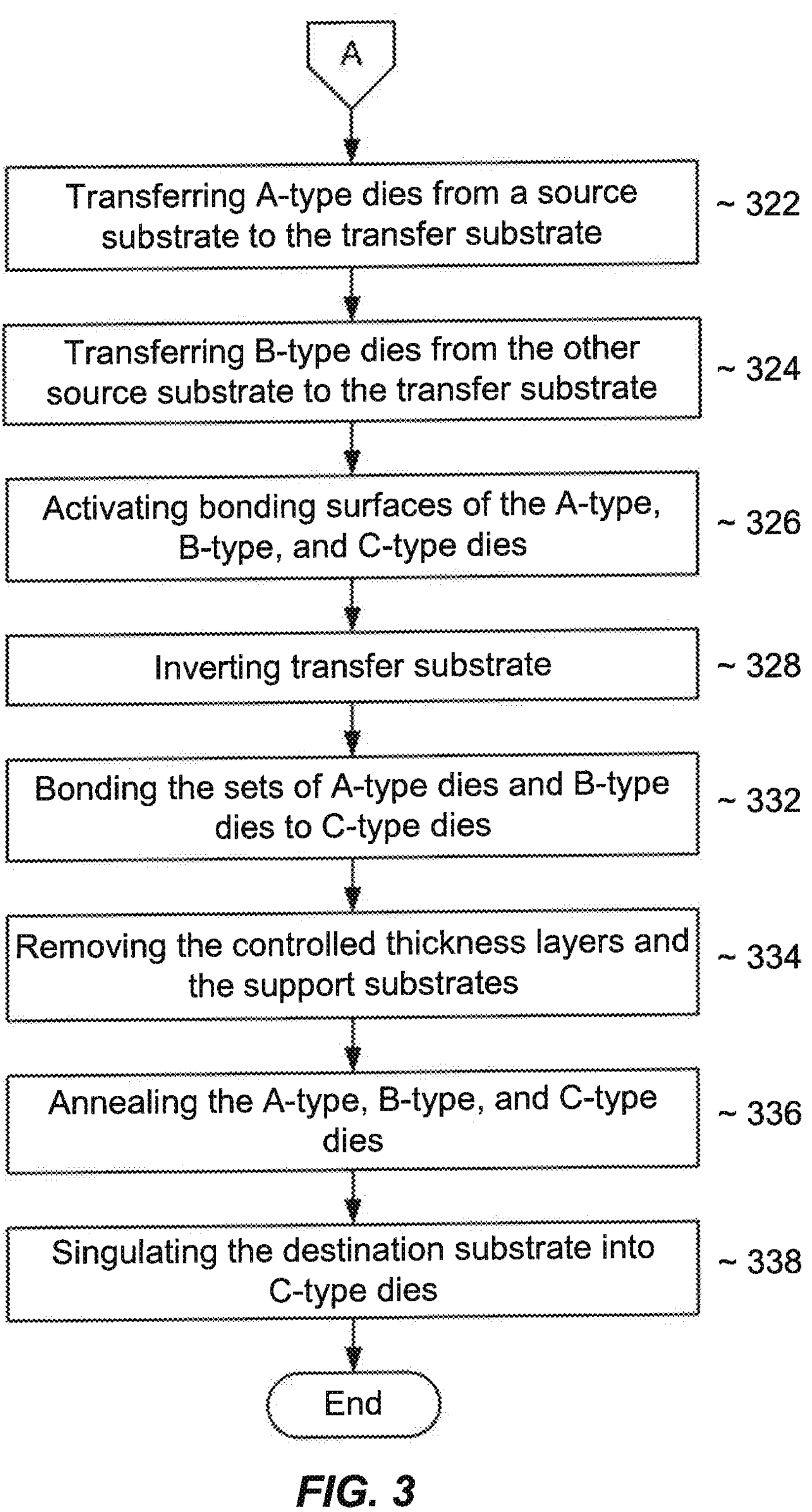

Attention is directed to methods of using the apparatus 100 when preparing dies and die structures and hybrid bonding die structures and dies together. FIGS. 2 and 3 include a process flow diagram of a method that is described with respect to FIGS. 4 to 15C.

As an overview of an embodiment, A-type dies associated the source substrate 122 and B-type dies associated with the source substrate 124 will be transferred to the transfer substrate 126. The transfer substrate 126 and the destination substrate 128 will be joined, such that A-type dies and B-type dies will be hybrid bonded to C-type dies associated with the destination substrate 128. An example of an A-type die, a B-type die, or a C-type die can be a type selected from the group consisting of a microprocessor, a microcontroller, a graphic processing unit, a digital signal processor, a memory chip (for example, a Level 2 or Level 3 cache, a flash memory, or the like), a power transistor chip, a power circuit chip, a communication chip, and the like. The A-type die, a B-type die, or a C-type die can be the same type or different types. In an embodiment, the C-type die can be a microprocessor, and the A-type die and the B-type die can be different types of memory, such as an L2 cache and a flash memory. Other combinations of A-type, B-type, and C-type dies can be used without deviating from the concepts described herein.

Figures 4, 5:
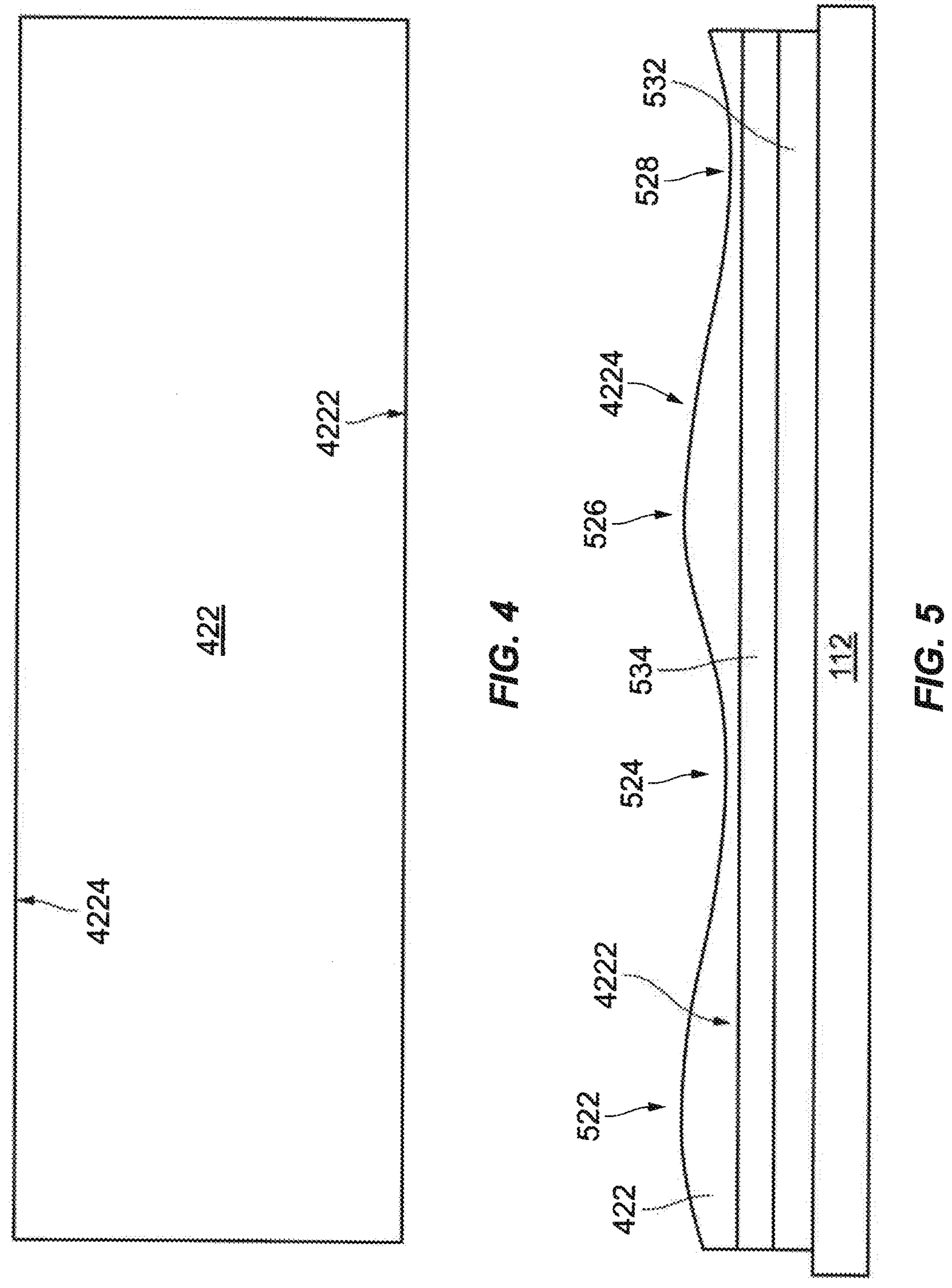
FIG. 4 includes an illustration of a cross-sectional view of a portion of a die substrate before thinning the die substrate.
FIG. 5 includes an illustration of a cross-sectional view of a substrate chuck after thinning the die substrate.

The method can include thinning a die substrate at block 202 in FIG. 2. FIG. 4 includes a die substrate 422 that can include a plurality of dies (not illustrated in FIG. 4), where each die has identical circuit components as compared to any other die within the die substrate 422. The die substrate 422 can include a device side 4222, which has most or all of the electrical circuit elements (not illustrated) of the dies, and a back side 4224 opposite the device side 4222. The die substrate 422 may further include TSVs (not illustrated). At this point in the process, the TSVs, if present within the die substrate 422, may or may not be exposed along the back side 4224 of the A-type substrate.

Before thinning, the die substrate 422 can be in the form of a wafer having a diameter in a range from 125 mm to 450 mm and a thickness in a range from 600 microns to 950 microns. The diameter, the thickness, or both may be less than or greater than values in the recited ranges. The die substrate can be thinned by back grinding, polishing, etching, or a combination of thereof. After thinning, TSVs, if present within the die substrate 422, will be exposed along the back side 4224 of the die substrate 422.

The demands of three-dimensional (3D) packaging means thinner dies, and hence, thinner substrates are used to meet electrical or performance specifications for an electronic device. As the average thickness becomes thinner, the die substrate 422 becomes more fragile, and thus, more likely to be damaged during processing or handling. When the average thickness is approximately 100 microns, significantly more care is needed to avoid damage to the die substrate 422 as compared to an average thickness of 300 microns. The likelihood of damage can increase exponentially as the average thickness is decreased below 100 microns. At an average thickness of 50 microns and lower, special care may be needed to avoid damage to the die substrate 422. In an embodiment, the average thickness of the die substrate 422 can be in a range of 10 microns to 50 microns after thinning.

Ideally, substrate thinning is performed such that the thickness of the die substrate 422 is uniform along all of the die substrate 422. In practice, the die substrate 422 can have a nonuniform thickness. FIG. 5 includes the die substrate 422 after thinning. The die substrate 422 has locations 522 and 526 that are relatively thicker as compared to locations 524 and 528. As the average thickness of the die substrate 422 decreases, the relatively thinner locations 524 and 528 are substantially more likely to become damaged before the relatively thicker locations 522 and 526. If needed or desired, a contour map of the back side 4224 of the die substrate 422 can be generated and stored within the memory 172 or elsewhere within or external to the apparatus 100.

After thinning, the die substrate 422 can be coupled to the source substrate chuck 112 via a backing layer 532 and an adhesive layer 534. The backing layer 532 can include a carrier wafer or a sheet of a polymer, and the adhesive layer 534 can be a pressure sensitive adhesive. The carrier wafer can be a semiconductor wafer or a glass plate. The combination of the backing layer 532 and adhesive layer 534 can be a dicing tape or a back grinding tape as used in the semiconductor industry. The backing layer 532 is held in place by the source substrate chuck 112.

Figures 6, 7:
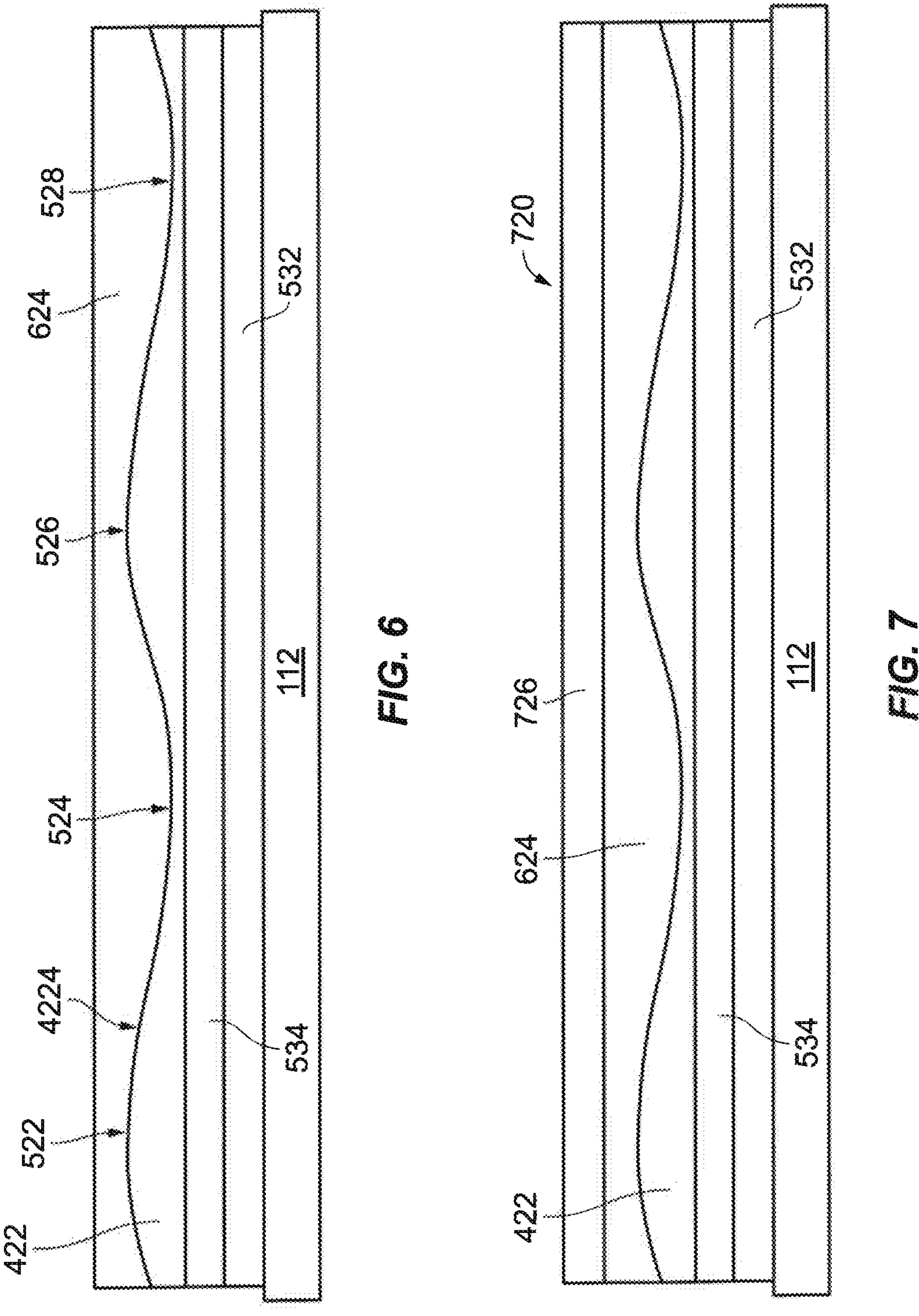
FIG. 6 includes an illustration of a cross-sectional view of a substrate chuck and the thinned die substrate of FIG. 5 after forming a controlled thickness layer over the thinned die substrate.
FIG. 7 includes an illustration of a cross-sectional view of the substrate chuck and the thinned die substrate of FIG. 6 after attaching a support substrate to the controlled thickness layer.

The method can include applying a controlled thickness layer over the die substrate at block 204 in FIG. 2. FIG. 6 includes a controlled thickness layer 624 over the die substrate 422 after the die substrate 422 is thinned. In the embodiment as illustrated in FIG. 6, the controlled thickness layer 624 has an exposed surface that is substantially more planar than the back side 4224 of the die substrate 422. The controlled thickness layer 624 can include a precursor that can be cured to form a polyacrylate, a polyepoxide (epoxy), a polyimide, or the like. The precursor for the controlled thickness layer 624 can be supplied at different areal densities. Referring to FIG. 1, the controller 170 or a local controller can use the contour map of the back side 4224 of the die substrate 422 to determine localized areal densities for the precursor. At relatively thicker locations 522 and 526, a relatively lower areal density of the precursor can be supplied, and at relatively thinner locations 524 and 528, a relatively higher areal density of the precursor can be supplied. The controller 170 or a local controller can transmit a signal for the controlled thickness material dispense module 130 to have the dispense head 136 dispense the precursor at the desired areal densities. In another embodiment, a uniform areal density can be used when supplying the precursor for the controlled thickness layer 624.

The amount of the precursor to be supplied to achieve a desired average thickness for the controlled thickness layer 624 can depend on a thickness of another die substrate and another support substrate. The average thickness for the controlled thickness layer 624 is described in more detail later in this specification.

The method can further include attaching a support substrate to the controlled thickness layer at block 206 in FIG. 2. Attaching the support substrate can begin by placing the support substrate in contact with the controlled thickness layer and curing the controlled thickness layer.

FIG. 7 illustrates a sandwich structure 720 that includes a support substrate 726 that is over the controlled thickness layer 624. Referring to FIGS. 1 and 7, the substrate transfer tool 150 can obtain the support substrate 726 from the support substrate pod 119 or the support substrate 726 can be provided from outside the apparatus 100. The controller 170 or a local controller can transmit a signal for the substrate transfer head 156 to position the support substrate 726 over the source substrate chuck 112 and the controlled thickness layer 624. The substrate transfer head 156 can be lowered, the source substrate chuck 112 can be raised, or both the substrate transfer head 156 can be lowered, and the source substrate chuck 112 can be raised until the support substrate 726 contacts the controlled thickness layer 624. The support substrate 726 is attached while controlling a gap between the support substrate 726 and the source substrate chuck 112. Flatness of a surface of the support substrate 726 is less than the flatness of the die substrate 422. The support substrate 726 is attached while correcting parallelism of the support substrate 726 and the source substrate chuck 112.

The controlled thickness layer 624 can be cured so that the precursor reacts to form a polymer or another solid compound. The substrate transfer head 156 may or may not be in contact with the support substrate 726 when curing is performed. The curing can be performed by exposing the controlled thickness layer 624 to actinic radiation. The actinic radiation may be in a range from 100 nm to 1000 nm. In such an embodiment, the support substrate 726 may allow at least 70% of the actinic radiation to be transmitted through it. Thus, curing can include transmitting the actinic radiation through the support substrate 726 to cure the controlled thickness layer 624. A radiation source for the actinic radiation (not separately illustrated) may be incorporated into the substrate transfer head 156 or may be moved into position from within the apparatus 100 or from outside the apparatus 100. In another embodiment, an anneal can be performed to thermally cure the controlled thickness layer 624. A heater used for thermally curing may be within the substrate transfer head 156, the source substrate chuck 112, or both. The controller 170 or a local controller can transmit a signal to equipment that includes the radiation source or the heater to activate the radiation source or the heater for a sufficient time to cure the controlled thickness layer 624.

Figures 8, 9:
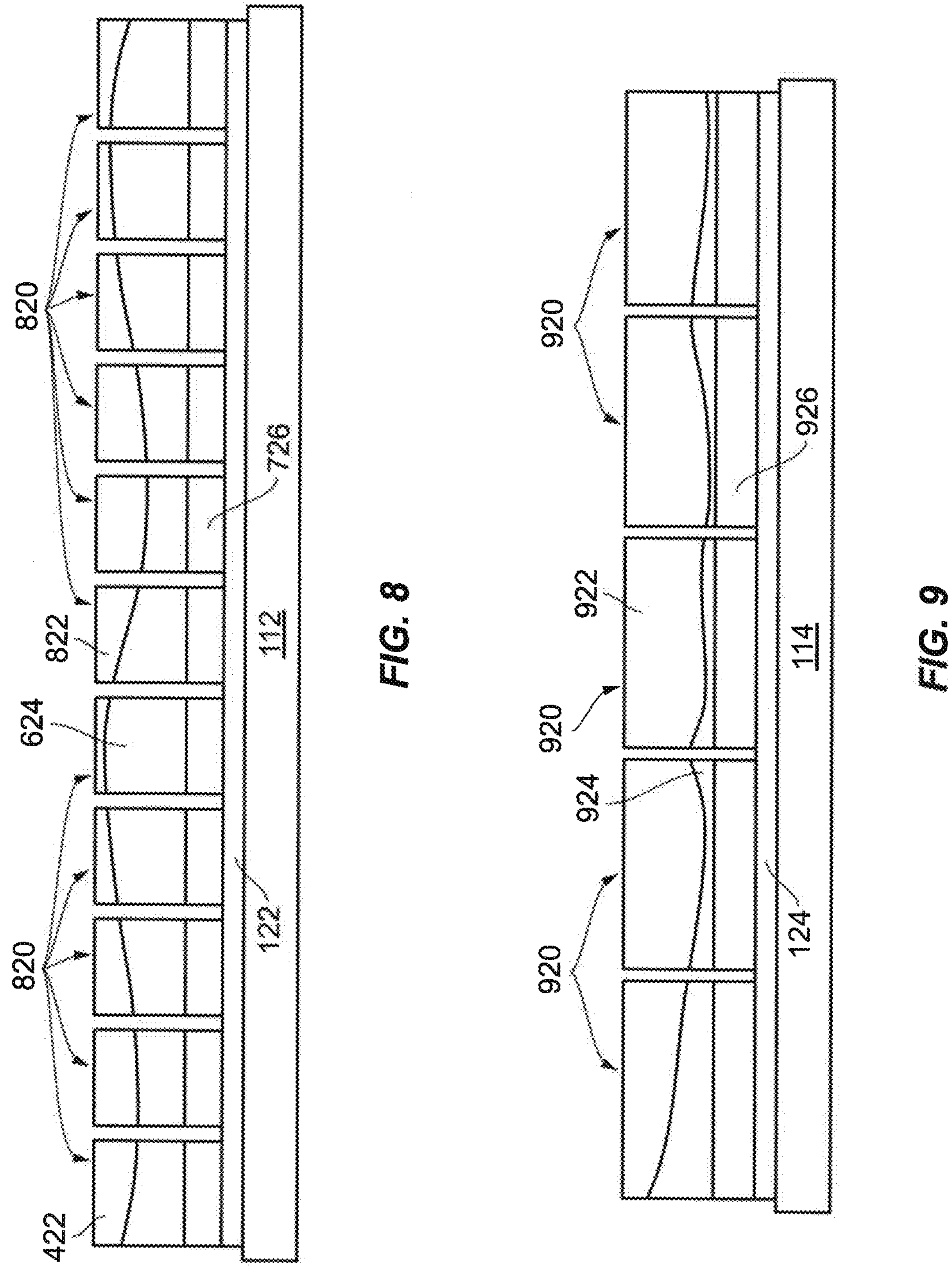
FIG. 8 includes an illustration of a cross-sectional view of the thinned die substrate of FIG. 7 after inverting the thinned die substrate, controlled thickness layer, and the support substrate, and singulating to form die structures.
FIG. 9 includes an illustration of a cross-sectional view of another substrate and other die structures.

The sandwich structure 720 that includes the die substrate 422, the thickness control layer 624, and the support substrate 726 can be removed from the adhesive layer 534. The sandwich structure 720 can be flipped over, and the support substrate 726 can become coupled to the source substrate 122 as illustrated in FIG. 8. The source substrate 122 can be a tape used for singulating a die substrate. The tape includes a polyvinylchloride, a polyolefin, a polyimide, a polyethylene terephthalate, or the like as a backing layer and a pressure sensitive adhesive. In an embodiment, tape can be a UV tape or a thermal release tape, where UV radiation or heating the tape at a range of 90° ° C. to 170° C. causes the adhesive to lose its adhesive strength. Before or after the source substrate 122 is coupled to the support substrate 726, the source substrate 122 is coupled to the source substrate chuck 112.

The method includes singulating the sandwich structure into die structures at block 208 in FIG. 2. Referring to FIGS. 1, 7, and 8, depending on the configuration of the apparatus 100, the sandwich structure 720 can be moved to the singulation tool 162 or the singulation tool 162 may be positioned over the source substrate chuck 112 and the sandwich structure 720. The cutting tool within the singulation tool 162 goes along scribe lanes between dies 822 to cut the sandwich structure 720 to define A-type die structures 820 that include the A-type dies 822. The controller or a local controller can transmit a signal so that the substrate transfer tool 150 transfers the source substrate 122 to the singulation tool 162 or moves the singulation tool 162 to a position over the source substrate 122.

If the sandwich structure 720 was moved to the singulation tool 162, after singulation, the substrate transfer tool 150 can move the source substrate 122 to the substrate chuck 112. If the singulation tool 162 was moved to a position over the sandwich structure 720, after singulation, the substrate transfer tool 150 can move the singulation tool 162 to its resting position within the apparatus 100 when the singulation tool 162 is not in use.

The method continues with determining if there is another die substrate to be processed at decision diamond 222 in FIG. 2. If no, the process continues with the remainder of the flow chart in FIG. 3. If another die substrate is to be processed ("YES" branch), the method is repeated for another die substrate starting at block 202 in FIG. 2. Some features of the A-type die structures 820 in FIG. 8 and B-type die structures 920 in FIG. 9 are described before continuing with the process.

In an embodiment, another die substrate includes B-type dies and is processed as previously described with respect to FIGS. 4 to 8. FIG. 9 illustrates the other die substrate after the actions described with respect to blocks 202 to 208 have been performed. The source substrate 124 is coupled to the source substrate chuck 114. The B-type die structures 920 are coupled to the source substrate 124 and include B-type dies 922, a controlled thickness layer 924, and a support substrate 926. All the materials, dimensions, processing techniques and other considerations described with respect to the die substrate 422, the controlled thickness layer 624, the support substrate 726, and the A-type die structures 820 can be used for B-type die substrate, the controlled thickness layer 924, the support substrate 926, and the B-type die structures 920, respectively. Any, some, or all of the materials, dimensions, processing techniques and other considerations described with respect to the die substrate 422, the controlled thickness layer 624, the support substrate 726, and the A-type die structures 820 may be the same or different from the materials, dimensions, processing techniques and other considerations for the other die substrate, the controlled thickness layer 924, the support substrate 926, and the B-type die structures 920, respectively. The A-type dies 822 are a different type as compared to the B-type dies, and thus, dimensions of the A-type dies 822 can be different from the B-type dies 922.

Figure 15A:
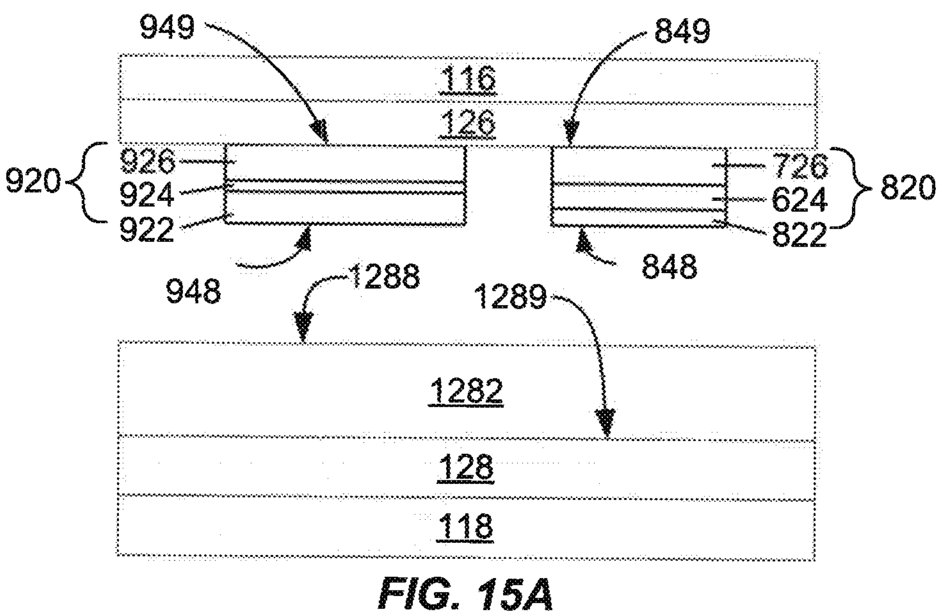
FIG. 15A includes an illustration of a cross-sectional view of portions of the transfer chuck, the transfer substrate and die structures attached thereto, the destination chuck, and the destination substrate after inverting the transfer substrate.

Thicknesses of the A-type die structures 820, the B-type die structures 920, and features within each of the die structures are better understood with respect to FIG. 15A. The average thicknesses of the A-type dies 822 and the B-type dies 922 can be different from each other, and the support substrates 726 and 926 may have the same thickness or different thicknesses. By properly determining the average thicknesses of the controlled thickness layers in the A-type die structures 820 and the B-type die structures 920, the thicknesses of the A-type die structures 820 and B-type die structures 920 can be closer to each other and reduce the likelihood of damaging A-type dies 822, B-type dies 922, or C-type dies 1282 (FIG. 12) during the bonding operation.

The A-type die structure 820 has a proximal surface 848 and a distal surface 849 opposite the proximal surface 848, where the proximal surface 848 is disposed between the distal surface 849 and the C-type die 1282. The B-type die structure 920 has a proximal surface 948 and a distal surface 949 opposite the proximal surface 948, where the proximal surface 948 is disposed between the distal surface 949 and a C-type die 1282. The C-type die 1282 has a proximal surface 1288 and a distal surface 1289 opposite the proximal surface 1288, where the proximal surface 1288 is disposed between (1) the distal surface 1289 of the C-type die 1282 and (2) the proximal surface 848 of the A-type die structure 820 and the proximal surface 948 of the B-type die structure 920.

The proximal surface 848 of the A-type die structure 820 and the proximal surface 948 of the B-type die structure 920 can be within a tolerance of being coplanar. In an embodiment, the proximal surfaces 848 and 948 are coplanar, meaning the proximal surfaces 848 and 948 lie along the same plane. In commercial production, a specification may allow for an acceptable tolerance with respect to being coplanar. The deviation from coplanarity can be measured as an acute angle or as a Z-direction distance. Each of the proximal surfaces 848 and 948 lie along a plane. The planes corresponding to the proximal surfaces 848 and 948 can intersect each other at an acute angle. The acute angle can be at most 1 milliradian, at most 10 microradians, or at most 0.3 microradians.

Figure 15B:
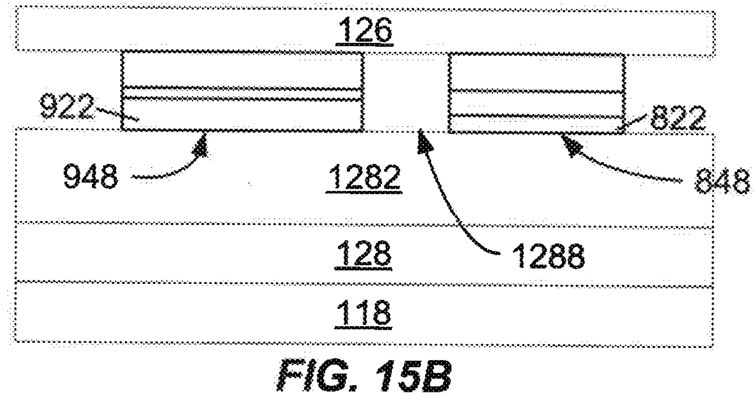
FIG. 15B includes an illustration of a cross-sectional view of portions of the transfer chuck, the transfer substrate and die structures attached thereto, the destination chuck, and the destination substrate after bonding the die structures to the destination substrate.
Figure 15C:
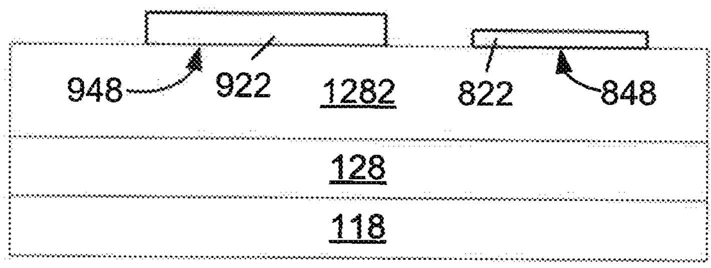
FIG. 15C includes an illustration of a cross-sectional view of portions of the transfer chuck, the transfer substrate, the destination chuck, and the destination substrate and die structures bonded thereto after removing support substrates and adhesion layers.

Regarding the Z-direction, an elevational difference may be used. The Z-direction can be used when the proximal surfaces 848 and 948 are offset in the Z-direction. Each of the proximal surfaces 848 and 948 lies at an average elevation above or below a reference plane. In FIGS. 15A to 15C, the reference plane can be a plane corresponding to the proximal surface 1288 of the C-die 1282 or one of the proximal surfaces 848 and 948. Thus, the elevational difference can be the absolute value of (1) the average elevation of the proximal surface 848 of the A-type die structure 820 over the proximal surface 1288 of the C-type die 1282 minus (2) the average elevation of the distal surface 949 of the B-type die structure 920 over the proximal surface 1288 of the C-type die 1282, or the elevational difference can be the absolute value of the average elevation of the proximal surface 848 of the A-type die structure 820 over or under the average elevation of the proximal surface 948 of the B-type die structure 920. The elevational difference can be at most 1 micron, at most 100 nm, at most 50 nm, at most 20 nm, or at most 5 nm.

Regarding the thickness of the controlled thickness layer, the combined thickness of the A-type die 822 and the support substrate 726 can be compared to the combined thickness of the B-type die 922 and the support substrate 926. As illustrated in FIG. 15A, the combined thickness of the B-type die 922 and the support substrate 926 is greater than the combined thickness of the A-type die 822 and the support substrate 726. The controlled thickness layer 924 has a thickness to provide sufficient adhesion between the B-type die 922 and the support substrate 926. The controlled thickness layer 924 can have an average thickness in a range of 20 nm to 1 micron.

The average thickness of the controlled thickness layer 624 can compensate for the difference between the combined thicknesses of the dies and the support substrates. Thus, the average thickness of the controlled thickness layer 624 can be (1) the average thickness of the controlled thickness layer 924 plus (2) the difference between (i) the combined thickness of the B-type die 922 and the support substrate 926 minus (ii) the combined thickness of the A-type die 822 and the support substrate 726. In the embodiment as illustrated in FIGS. 15A and 15B, the average thicknesses of the A-type die structure 820 and the B-type die structure 920 will be the same or approximately the same, and the distal surface 849 of the A-type die structure 820 and the distal surface 949 of the B-type die structure 920 will lie at the same or approximately the same average elevation above the proximal surface 1288 of the C-type die 1282.

Support substrates may be sold in different nominal thicknesses. For example, a support substrate with a 100 micron nominal thickness may have a thickness of 100 microns+/−0.5 microns, and a support substrate with a 50 micron nominal thickness may have a thickness of 50 microns+/−0.3 microns. If the support substrates 726 and 926 have the same actual or nominal thickness, the difference in thicknesses between the A-type die 822 and the B-type die 922 may be used the instead of the combined thicknesses previously described when determining a thickness for the controlled thickness layer 624. Further, the average thicknesses of the thinned die substrates for the A-type die 822 and the B-type die 922 may be used instead of the thickness of the dies themselves.

With respect to the apparatus 100 in FIG. 1, thickness information regarding the A-type die 822, the B-type die 922, and the support substrates 726 and 926 can be provided to the controller 170 or a local controller. If desired, such thickness information may be stored in the memory 172. The average thickness of the controlled thickness layer 924 can be a specified thickness (from a process specification) or an actual thickness. The controller 170 or a local controller can determine an average thickness for the controlled thickness layer 624 and transmit a signal with such information that can be used by the controlled thickness material dispense module 130 for the dispense head 136 to supply the precursor for the controlled thickness layer 624 to achieve the desired average thickness.

Figure 10:
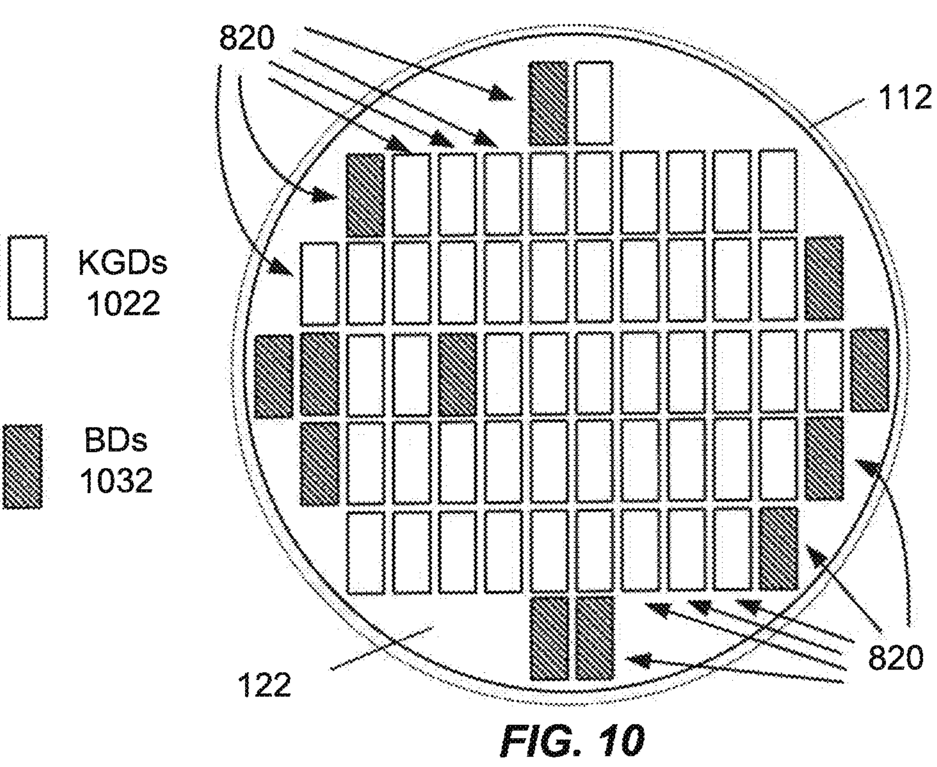
FIG. 10 includes an illustration of a top view of a substrate chuck and source substrate including die structures with known good dies and die structures with bad dies.
Figure 11:
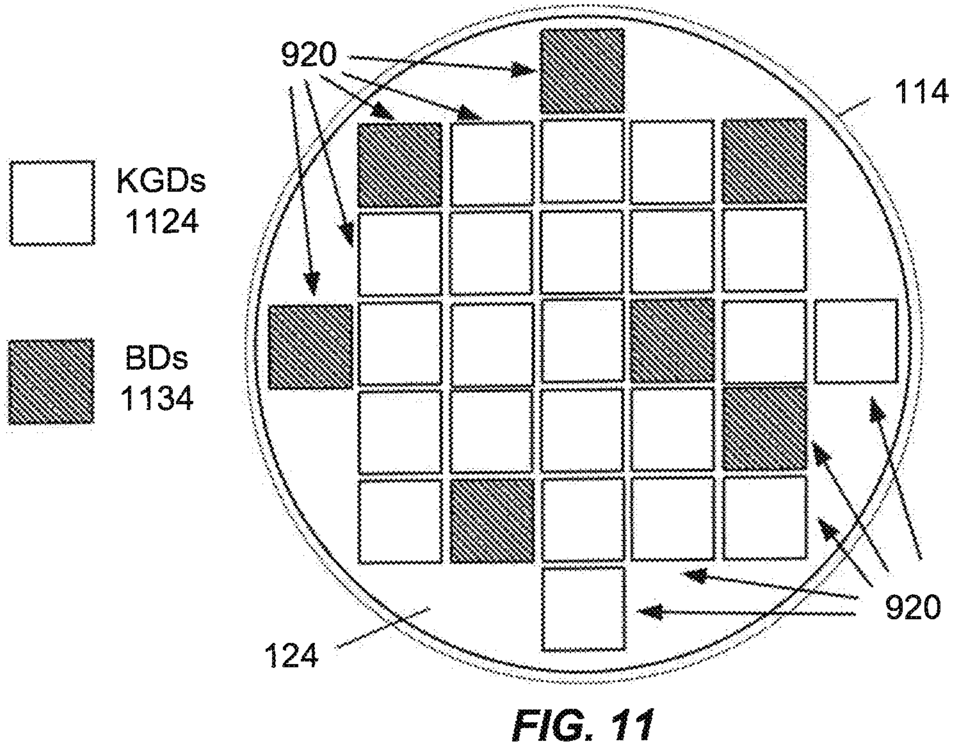
FIG. 11 includes an illustration of a top view of another substrate chuck and another source substrate including other die structures with known good dies and other die structures with bad dies.
Figure 12:
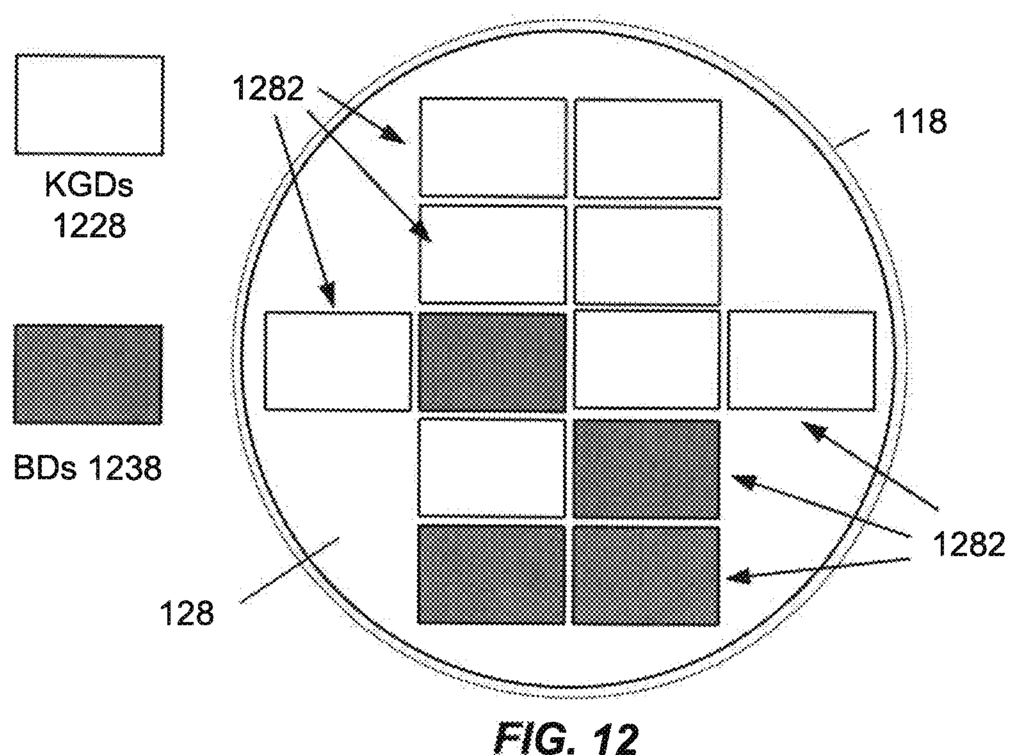
FIG. 12 includes an illustration of a top view of a further substrate chuck and a destination substrate including known good dies and bad dies.

FIGS. 10 to 12 illustrate substrate chucks, substrates, and die structures and dies. FIG. 10 includes the source substrate chuck 112, the source substrate 122, and the A-type die structures 820. In FIG. 10, Known Good Dies (KGDs) 1022 are A-type dies that passed electrical tests and can be used in making a functional electronic device. Bad Dies (BDs) 1032 are A-type dies that failed an electrical test and are illustrated with hatched lines. FIG. 11 includes the source substrate chuck 114, the source substrate 124, and the B-type die structure 920. In FIG. 11, KGDs 1124 are B-type structures that include B-type dies that passed electrical tests and can be used in making a functional electronic device. BDs 1134 are B-type die structures that include B-type dies that failed an electrical test and are illustrated with hatched lines. FIG. 12 includes the destination substrate chuck 118, the destination substrate 128, and C-type dies 1282 associated with the destination substrate 128. The C-type dies 1282 can be within the destination substrate 128 (illustrated) or may be C-type dies 1282 or C-type die structures that are attached to the destination substrate 128. In FIG. 12, KGDs 1228 are C-type dies that passed electrical tests and can be used in making a functional electronic device. BDs 1238 are C-type dies that failed an electrical test and are illustrated with shaded boxes.

Figure 13:
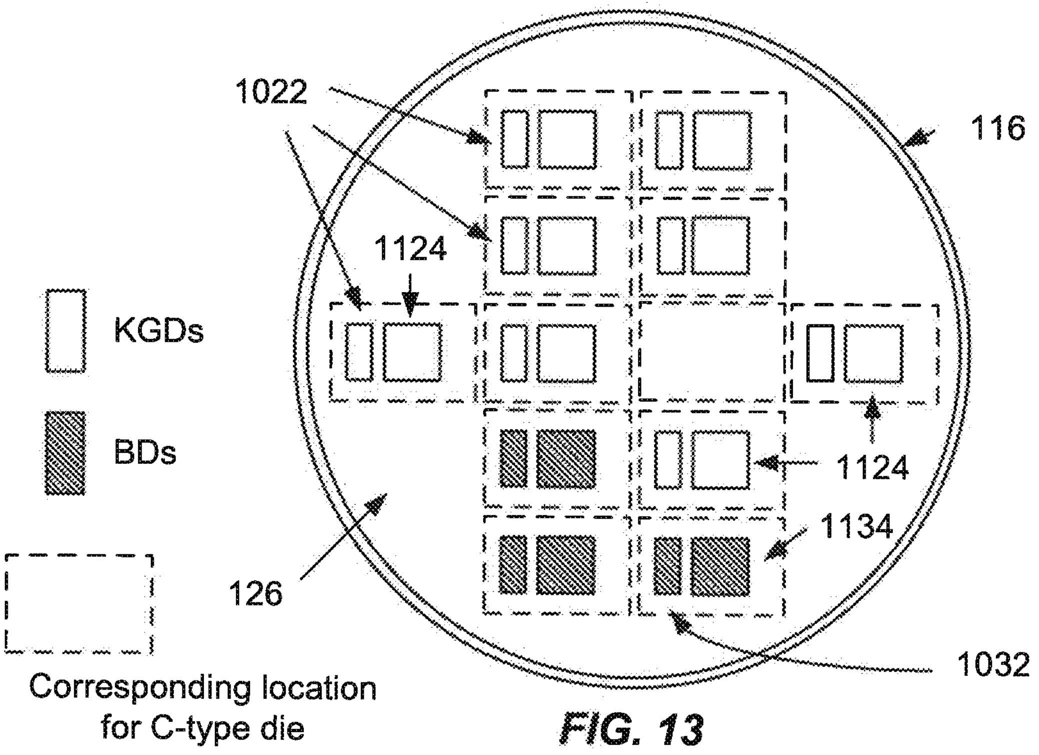
FIG. 13 includes an illustration of a top view of a substrate chuck and a transfer substrate after die structures with different dies are transferred from the source substrates to the transfer substrate.

The method can continue with transferring A-type dies from a source substrate to the transfer substrate at block 322 and transferring B-type dies from a source substrate to the transfer substrate at block 324 in FIG. 3. FIG. 13 includes the transfer substrate chuck 116 and the transfer substrate 126 after A-type dies and B-type dies are transferred to the transfer substrate 126. During a subsequent operation, the transfer substrate 126 or the destination substrate 128 will be inverted by flipping one of the substrates from side to side. Referring to FIGS. 12 and 13, after inversion, the right-hand side of the destination substrate 128 will be near the left-hand side of the transfer substrate 126, and the left-hand side of the destination substrate 128 will be near the right-hand side of the transfer substrate 126. Thus, the pattern of A-type dies and B-type dies on the transfer substrate 126 (FIG. 13) is a mirror image of where such dies will be bonded to the C-type dies 1282 associated with the destination substrate 128 (FIG. 12). The dashed lines in FIG. 13 correspond to locations of C-type dies on FIG. 12, although the transfer substrate 126 does not include any C-type dies. FIG. 15A illustrates the transfer substrate 126 and the destination substrate 128 after the inversion is completed.

Referring to FIGS. 1, 10, and 13, the controller 170 or a local controller can transmit a signal so that the die transfer tool 140 moves, and the die transfer head 146 is positioned over the source substrate 122. Pick-up heads within the die transfer head 146 can be at or changed to an A-type die source-matching pitch for the source substrate 122. The controller 170 or a local controller can transmit a signal so that the die transfer head 146 can pick up a set of A-type die structures 820 from the source substrate 122. After picking up the A-type die structures 820 from the source substrate 122, the controller 170 or a local controller can transmit a signal so that the pitch of the pick-up heads within the die transfer head 146 are changed to an A-type die transfer-matching pitch. The A-type die transfer-matching pitch corresponds to the pitch of the A-type die structures 820 that are being placed onto the transfer substrate 126. The transfer of the A-type die structures 820 can be repeated for one or more transfer cycles until the transfer operation for the A-type die structures 820 to the transfer substrate 126 is completed.

Referring to FIGS. 1, 11, and 13, the controller 170 or a local controller can transmit a signal so that the die transfer tool 140 moves, and the die transfer head 146 is positioned over the source substrate 124. The controller 170 or a local controller can transmit a signal so that the pick-up heads within the die transfer head 146 can be changed to a B-type die source-matching pitch for the source substrate 124. The controller 170 or a local controller can transmit a signal so that die transfer head 146 can pick up a set of B-type die structures 920 from the source substrate 124. After picking up the B-type die structures 920 from the source substrate 124, the controller 170 or a local controller can transmit a signal so that the pitch of the pick-up heads within the die transfer head 146 are changed to a B-type die transfer-matching pitch. The B-type die transfer-matching pitch corresponds to the pitch of the B-type die structures 920 that are being placed onto the transfer substrate 126. The B-type die transfer-matching pitch that may be the same or different from the A-type die transfer-matching pitch. The A-type die structures 820 and the B-type die structures 920 can be offset from one another because the die structures are not stacked one over the other. The transfer of the B-type die structures 920 can be repeated for one or more transfer cycles until the transfer operation for the B-type die structures 920 to the transfer substrate 126 is completed.

KGDs 1022 (FIG. 10) of the A-type die structures are transferred to sites on the transfer substrate 126 (FIG. 13) that correspond to positions for KGDs 1228 of C-type dies (FIG. 12) associated with the destination substrate 128. KGDs 1124 (FIG. 11) of the B-type die structures are transferred to sites on the transfer substrate 126 (FIG. 13) that correspond to positions for KGDs 1228 of C-type dies (FIG. 12) associated with the destination substrate 128.

In FIG. 12, the BDs 1238 of C-type dies associated with the destination substrate 128 may or may not be covered by a die, a die structure, or another object. In FIG. 12, a set of BDS 1238 located near the bottom of the destination substrate 128 occupy a significant area. A subsequent bonding operation may be more complicated if the set of BDs 1238 are not covered by corresponding A-type die structures, B-type die structures, both A-type die structures and B-type die structures, or a dummy structure. The risk of damage to KGDs 1228 (FIG. 12) or the KGDs 1022 and 1124 (FIG. 13) that will be subsequently bonded to the KGDs 1228 or the risk of damage to the destination substrate 128 may be relatively higher as compared to other parts of the destination substrate 128 or KGDs 1022, 1124, and 1228 that are farther from the set of BDS 1238 near the bottom of the destination substrate 128. BDs 1032 from the source substrate 122 (FIG. 10) and BDs 1134 from the source substrate 124 (FIG. 11) may be transferred to locations on the transfer substrate 126 (FIG. 13) that correspond to the set of BDs 1238 associated with the destination substrate (FIG. 12).

Alternatively, one or more dummy dies or dummy die structures may be used in place of the BDs 1032 and 1134. The one or more dummy dies or die structures may occupy at least 50% of the area that would have been otherwise occupied by the BDs 1032 and 1134. The dummy dies or dummy die structures can have the same or approximately the same thickness as the KGDs 1022 and 1124. Any one or more of dummy structures may individually occupy an area that is the same or similar to one of the BDs 1032, one of the BDs 1134, a pair of a BD 1032 and a BD 1134, or an area occupied by the BD 1032, BD 1134, and a gap between such pair of the BD 1032 and the BD 1134.

The dummy structures can be made from a material that can withstand the subsequent bonding operation. The dummy dies or die structures can include Si, glass, or another material. In a particular embodiment, the dummy die or die structures can be made from a wafer that was misprocessed or rejected earlier in the process flow. When a dummy die structure is fabricated, the wafer can be thinned and processed similar to the die substrates when forming the A-type die structures and B-type die structures. Similar to the A-type dies and B-type dies, the one or more dummy dies or die structures should have surfaces that are substantially coplanar with the device sides of the KGDs 1022 and 1124 when the one or more dummy dies or die structures are over the destination substrate 128 and meet the previously described values for the acute angles or Z-direction dimensions with respect to the A-type die structures 820 and B-type die structures 920.

In summary, non-functional or defective BDs 1032 and 1134 or dummy structures can be bonded to non-functional or defective BDs 1238 associated with the destination substrate 128. The presence of the BDs 1032 and 1134 or dummy structures can allow for a more uniform force to be applied across more of the destination substrate 128 as compared to the BDs 1032 and 1134 not being present.

Near the center of FIG. 12, one of the BDs 1238 is isolated and surrounded by KGDs 1228. The isolated BD 1238 may not complicate a subsequent bonding operation. Therefore, BDs 1032, 1134, or one or dummy dies or die structures may not be present over the isolated BD 1238.

After reading this specification, skilled artisans will be able to determine whether the BDs 1032 and 1134 or one or more dummy dies or dummy die structures are to be transferred to the transfer substrate 126. Transferring the BDs 1032 and 1134 or one or more dummy dies or dummy die structures to the transfer substrate 126 may adversely affect the throughput; however, the BDs 1032 and 1134 or one or more dummy dies or dummy die structures may help to improve yield, reduce risk of damaging KGDs 1022, 1124, 1228, the destination substrate 128, or a combination thereof, or both improve yield of good, bonded dies and reduce the risk of damage. Therefore, skilled artisans will be able to determine whether or not to use the BDs 1032 and 1134 or one or more dummy dies or dummy die structures, and if so, where such the BDs 1032 and 1134 or one or more dummy dies or dummy die structures are to be positioned.

The method further includes activating bonding surfaces of the A-type dies, the B-type dies, and the C-type dies at block 326 in FIG. 3. The exposed surfaces of the A-type dies 822 of the A-type die structures 820, the B-type dies 922 of the B-type die structures 920, and the C-type dies 1282 of the destination substrate 128 can be activated if such activation has not yet been performed. The exposed surfaces can be activated by exposing the surfaces to a plasma treatment and deionized water rinse to hydrate the surfaces. The activation helps with bonding the A-type dies 822 and the B-type dies 922 to the C-type dies 1282.

The method can include inverting the transfer substrate at block 328 in FIG. 3. Referring to FIGS. 12, 13, and 15A, the transfer substrate 126 is inverted by flipping the transfer substrate 126 from side-to-side rather than from top-to-bottom. Thus, the right-hand side of the transfer substrate 126 in FIG. 13 will be closer to the right-hand side of the destination substrate 128 in FIG. 12, and the left-hand side of the transfer substrate 126 in FIG. 13 will be closer to the left-hand side of the destination substrate 128 in FIG. 12. FIG. 15A illustrates the illustrates the transfer substrate 126 including A-type die structures 820 and B-type die structures 920 held by a transfer substrate chuck 116 inverted and above a C-type die 1282 on a destination substrate 128 held by a destination substrate chuck 118.

Registration and metrology operations can be performed to position properly bonding sites of the KGDs 1022 and KGDs 1124 with respect to bonding sites of the KGDs 1228. In an embodiment, the substrate transfer head 156 of the substrate transfer tool 150 can be used to invert and position the transfer substrate 126. In another embodiment, a separate tool (not illustrated) within or outside the apparatus 100 can be used to invert and position the transfer substrate 126. The controller 170 or a local controller can transmit signals for the inversion, registration and metrology, and positioning operations to portions of the apparatus 100 to carry out the operations described.

Figure 14:
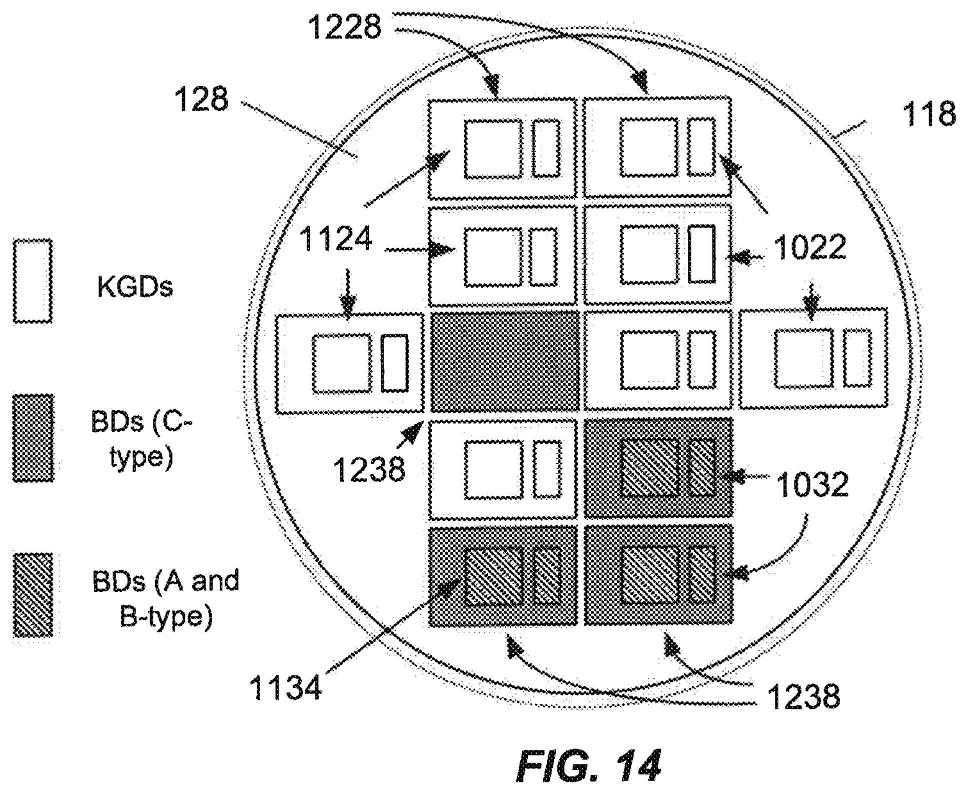
FIG. 14 includes an illustration of a top view of the substrate chuck and the destination substrate of FIG. 12 after bonding die structures from the transfer substrate of FIG. 13 to the destination substrate.

The method can further include bonding the sets of A-type dies and B-type dies to C-type dies at block 332 in FIG. 3. FIG. 14 includes a top view of the destination substrate 128, and FIG. 15B illustrates one of the A-type die structures 820 and one of the B-type die structures 920 after they are bonded to a C-type die 1282, and the die structures are still attached to the transfer substrate 126. The dies will be hybrid bonded that includes a bonding operation and at least one anneal operation.

The bonding operation is performed to bond the A-type dies 822 that are part of the A-type die structures 820 and the B-type dies 922 that are part of the B-type die structures 920 to the C-type dies 1282 associated with the destination substrate 128. In an embodiment, the bonds can be oxide-to-oxide bonds. Referring to FIG. 1, the controller 170 or a local controller can transmit a signal so that the substrate transfer head 156 of the substrate transfer tool 150 moves the bonding head 164 over the transfer substrate 126 after the transfer substrate 126 is inverted and positioned over the destination substrate 128. Pressure during bonding can be applied by the bonding head 164, the substrate transfer head 156, the substrate chuck 118, or a combination thereof.

The pressure during bonding can be in a range 0.5 $N/cm^2$ to 20 $N/cm^2$. Referring to FIG. 15B, the coplanar or substantially coplanar surfaces of the distal surfaces 849 along the A-type die structures 820 and the distal surfaces 949 of the B-type die structures 920, and, when present, the BDs 1032 and 1134 or one or more dummy dies or dummy die structures can help to ensure at least the A-type dies 822 and B-type dies 922 are bonded to the C-type dies 1282. When present, the BDs 1032 and 1134 or one or more dummy dies or dummy die structures can help to distribute more evenly the force over the destination substrate 128 during the bonding operation.

The bonding can be performed at room temperature (for example, at a temperature in a range from 20° C. to 25° C.) or higher. Bonding is performed at a temperature less than a subsequent anneal to expand conductive metal within the dies and at the destination bonding sites. The temperature and pressure may be limited depending on films present during bonding or components within the apparatus 100. For example, the temperature may be no higher than approximately 200° ° C. After reading this specification, skilled artisans will be able to determine the pressure and temperature used for bonding. The bonding head 164 can be moved away from over the transfer substrate 126 after bonding. The controller 170 or a local controller can transmit a signal so that the substrate transfer tool 150 moves the bonding head 164 from a location near the substrate chuck 118 to its position as illustrated in FIG. 1.

The method can further include removing the controlled thickness layers and the support substrates at block 334 in FIG. 3. FIG. 15C illustrates one of the A-type dies 822 and one of the B-type dies 922 after they are bonded to a C-type die 1282 after the transfer substrate 126, the controlled thickness layers, the support substrates are removed. The removal can be performed by etching materials within the support substrates 726 and 926, the controlled thickness layers 624 and 924, or a combination of the support substrates 726 and 926 and the controlled thickness layers 624 and 924. When the support substrates includes $SiO_2$ or Si, a fluorine-containing plasma etch can be used. The fluorine-containing gas can include a methyl fluoride gas ($CH_xF_{4-x}$, where x is 0 to 3), $SF_6$, $NF_3$, or the like. Alternatively, a wet etchant may be used, such as HF for $SiO_2$ or such as a hydroxide (e.g., KOH, NaOH, $(CH_3)_4NOH$) or a mixture of an oxidizer and HF (for example, a mixture of $HNO_3$ and HF) for Si. If the etching is performed isotropically, sidewalls of the A-type dies and B-type dies may be protected before etching.

The controlled thickness layers can be removed by plasma etching, and when the controlled thickness layers include an organic material, such as a polymer. The plasma can be generated using an oxidizing gas can be used. For example, the plasma can be formed from $O_2$, $N_2O$, $O_3$, or the like. The removal of the controlled thickness layers and support substrates is optional and is not required in all embodiments.

FIG. 15C includes a cross-sectional view of an A-type die structure 820, a B-type die structure 920 and a C-type die. The A-type die 822 of the A-type die structure 820 and the B-type die 922 of the B-type die structure 920 are bonded to the C-type die 1282. Many features seen in FIG. 15C are described earlier in this specification.

FIG. 14 includes an illustration of a top view of the destination substrate 128. KGDs 1022 and 1124 (that include good A-type dies and good B-type dies) are bonded to KGDs 1228 (good C-type dies). Some BDs 1238 (bad C-type dies) have BDs 1032 and 1134 (that include bad A-type dies and bad B-type dies) bonded to the BDs 1238.

The method can include annealing the A-type, B-type, and C-type dies at block 336 in FIG. 3. One or more anneals can be performed as part of the hybrid bonding process. An anneal can cause the metal within the A-type, B-type, and C-type dies at the bonding sites to expand and contact each other. The anneal can be performed at a temperature in a range of 180° C. to 300° C. An optional further anneal can cause metal atoms to cross the metal-metal interface and reduce contact resistance and is performed at a temperature in a range of 300° C. to 400° C.

Referring to FIG. 1, the destination substrate 128 can be moved to the annealing station 166 of the apparatus 100 or to a different tool within or outside the apparatus 100. The controller 170 or a local controller can transmit a signal so that the substrate transfer head 156 of the substrate transfer tool 150 moves the destination substrate 128 to the annealing station 166 or to another location within the apparatus 100. After proper placement of the destination substrate 128 with respect to the annealing station 166, the controller 170 or a local controller can transmit a signal so that the annealing station 166 performs the anneal operation(s). If the anneal is performed outside of the apparatus 100, the substrate transfer head 156 can move the destination substrate 128 to a location where the destination substrate 128 can be transferred out of the apparatus 100. The previously described anneal(s) can be performed in an annealing tool outside the apparatus 100.

The method can further include singulating the destination substrate into C-type dies at block 338 in FIG. 3. Singulating of the destination substrate 128 can be performed by the singulation tool 162 using any of the techniques previously described with respect to singulating to form the A-type die structures 820 and the B-type die structures 920. The singulating technique for the destination substrate 128 may be the same or different as compared to singulating when forming the A-type die structures 820 or the B-type die structures 920.

Referring to FIG. 1, depending on the configuration of the apparatus 100, the destination substrate 128 can be moved to the singulation tool 162, or the singulation tool 162 may be positioned over the destination substrate chuck 118 and the destination substrate 128. The cutting tool within the singulation tool 162 goes along scribe lanes between C-type dies 1282 to cut the destination substrate 128 to define C-type dies 1282. The controller or a local controller can transmit a signal so that the substrate transfer tool 150 transfers the destination substrate 128 to the singulation tool 162 or moves the singulation tool 162 to a position over the destination substrate 128.

If the destination substrate 128 is moved by the singulation tool 162, after singulation, the substrate transfer tool 150 can move the destination substrate 128 to a location within the apparatus for holding completed destination substrates 128. If the singulation tool 162 is moved to a position over the destination substrate 128, after singulation, the substrate transfer tool 150 can move the singulation tool 162 to its resting position within the apparatus 100 when the singulation tool 162 is not in use.

If needed or desired, other dies may be positioned and bonded to the A-type dies 822, B-types 922, or the C-type dies 1282. For example, other A-type dies can be positioned and bonded to the A-type die already bonded to the C-type die. Such a configuration can be useful in forming a memory array that includes a vertical stack of memory dies, where the A-type dies are memory dies that have the same electronic components. For the A-type die 822 (lower A-type die) bonded to the C-type die 1282, the controlled thickness layer 624 and the support substrate 726 can be removed before bonding the next A-type die (upper A-type die). TSVs within the lower A-type die allow the upper A-type die to be electrically coupled to the lower A-type die, the C-type die 1282, or both. With respect to hybrid bonding, all bonding operations may be performed before any of the anneals associated with hybrid bonding are performed. In another embodiment, one or more of the anneals associated with hybrid bonding may be performed before all bonding operations are completed.

As previously described, FIG. 15B includes a cross-sectional view of the A-type die structure 820 and a B-type die structure 920 to the C-type die 1282. The average thickness of the A-type die 822 is less than the average thickness of the B-type die 922, the average thickness of the controlled thickness layer 624 is greater than the average thickness of the controlled thickness layer 924, and the thicknesses of the support substrates 726 and 926 are substantially the same.

Figure 16:
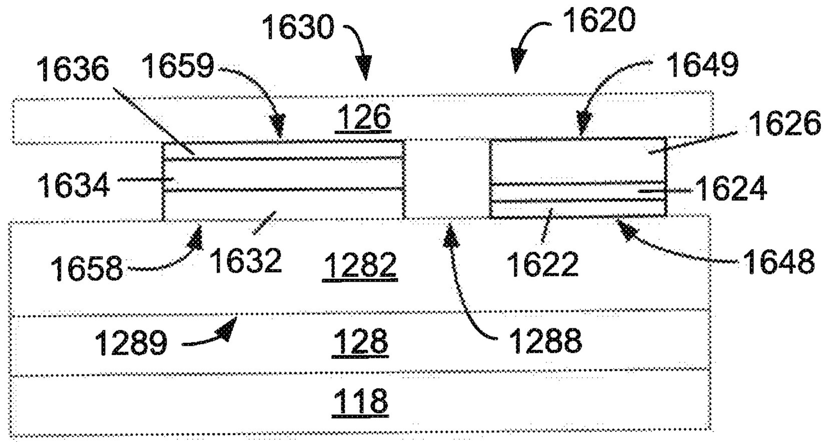
FIG. 16 includes an illustration of a cross-sectional view of portions of the substrate chuck, the destination substrate, and other die structures bonded to a die associated with the destination substrate.

Referring to FIG. 16, support substrates can have different thicknesses. An A-type die structure 1620 and a B-type die structure 1630 are bonded to the C-type die 1282. The A-type die structure 1620 has a proximal surface 1648 and a distal surface 1649 opposite the proximal surface 1648, where the proximal surface 1648 is disposed between the distal surface 1649 and the C-type die 1282. The A-type type die structure 1620 includes an A-type die 1622, a controlled thickness layer 1624, and a support substrate 1626. The B-type die structure 1630 has a proximal surface 1658 and a distal surface 1659 opposite the proximal surface 1658, where the proximal surface 1658 is disposed between the distal surface 1659 and the C-type die 1282. The B-type die structure 1630 includes a B-type die 1632, a controlled thickness layer 1634, and a support substrate 1636.

When comparing the A-type die structure 1620 to the B-type die structure 1630, the thickness of the A-type die 1622 is less than the thickness of the B-type die 1632. The support substrate 1626 is relatively thicker and helps to keep the thickness of controlled thickness layer 1624 in the A-type die structure 1620 from becoming too large. The thickness of the controlled thickness layer 1624 can have a thickness as previously described with respect to the controlled thickness layer 924. The thickness of the controlled thickness layer 1634 can have a thickness as previously described with respect to the controlled thickness layer 624. When comparing the A-type die structure 1620 to the B-type die structure 1630, the A-type die 1622 has an average thickness that is thinner as compared to the B-type die 1632, and the controlled thickness layer 1624 has an average thickness that is thinner as compared to the controlled thickness layer 1634.

Figure 17:
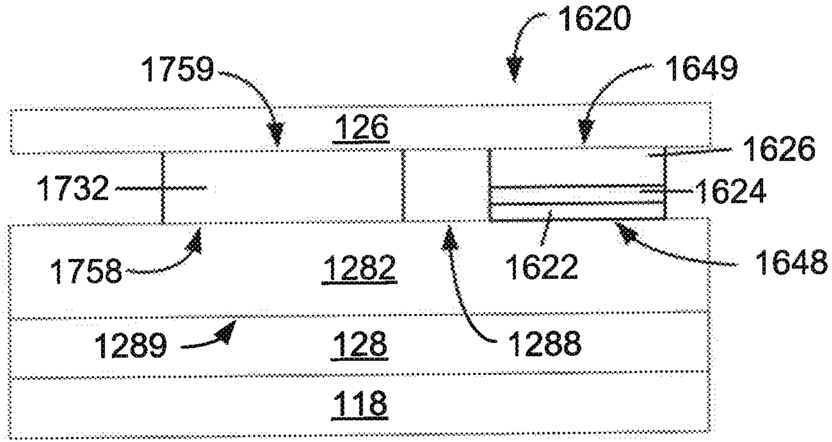
FIG. 17 includes an illustration of a cross-sectional view of portions of the substrate chuck, the destination substrate, a die and a die structure bonded to a die associated with the destination substrate.

A die may have an average thickness such that a controlled thickness layer and a support substrate are not needed. Referring to FIGS. 1 and 17, a B-type die 1732 has an average thickness where it can be picked up by a pick-up head in the die transfer head 146 of the die transfer tool 140. The B-type die 1732 has a proximal surface 1758 and a distal surface 1759 opposite the proximal surface 1758, where the proximal surface 1758 is disposed between the distal surface 1759 and the C-type die 1282. The average thickness of the controlled thickness layer 1624 is selected so that the distal surface 1649 of the A-type die structure 1620 and the distal surface 1659 of B-type die 1732 are coplanar or approximately coplanar when bonded to the C-type die 1282. The average thickness for the controlled thickness layer 1624 can be the average thickness of the B-type die 1732 minus the average thickness of the A-type die 1622 minus the thickness of the support substrate 1626.

Within this specification, average values for parameters, such as average thicknesses and average elevations, are described. Median values for the parameters or single values for the parameters (for example, one thickness measurement or one elevation measurement) may be used instead of average values.

Embodiments described above use a controlled thickness layer to help when hybrid bonding a plurality of dies to a destination substrate. When a die substrate is thinned, the thickness of the thinned die substrate may be nonuniform. A precursor for the controlled thickness layer can be supplied at a higher areal density at a location where the die substrate is relatively thinner and at a lower areal density at a location where the die substrate is relatively thicker. After the die substrate is singulated, the thicknesses of die structures are likewise more uniform between the different die structures that include different portions of the same die substrate. Thus, the controlled thickness layer can help compensate for the nonuniform thickness of the die substrate.

The controlled thickness layer can also be used to reduce the difference in thickness between a die structure having one type of die and another die or die structure having a different type of die. In 3D packaging, different types of dies can be electrically connected with TSVs. Thus, the die structures having different types of dies can be bonded to other dies that are associated with a destination substrate. The controlled thickness layers for the die structures with different types of dies can be selected so that the thicknesses of the die structures are close to each other. The distal surfaces of the die structures can be coplanar or substantially coplanar and makes a bonding operation easier and less likely to damage one of the die structures or the underlying die associated with the destination substrate.

Note that not all of the activities described above in the general description or the examples are required, that a portion of a specific activity may not be required and that one or more further activities can be performed in addition to those described. Still further, the order in which activities are listed is not necessarily the order in which they are performed.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations can also be provided in combination in a single implementation, and conversely, various features that are, for brevity, described in the context of a single implementation, can also be provided separately or in any subcombination. Further, reference to values stated in ranges includes each and every value within that range. Many other implementations can be apparent to skilled artisans only after reading this specification. Other implementations can be used and derived from the disclosure, such that a structural substitution, logical substitution, or another change can be made without departing from the scope of the disclosure. Accordingly, the disclosure is to be regarded as illustrative rather than restrictive.

What is claimed is:

1. An apparatus, comprising:

a first die substrate chuck for holding a first die substrate including a plurality of first dies, wherein the first die substrate has a first nonuniform thickness, a device side, and a back side opposite the device side;

a second die substrate chuck for holding a second die substrate including a plurality of second dies, wherein the second die substrate has a second nonuniform thickness, a device side, and a back side opposite the device side, and the first die substrate has a different average thickness as compared to the second die substrate;

a dispense module configured to supply:

a first thickness layer onto the back side of the first die substrate to compensate for the first nonuniform thickness of the first die substrate, and a second thickness layer onto the back side of the second die substrate to compensate for the second nonuniform thickness of the second die substrate;

a transfer substrate chuck for holding a transfer substrate; and a die transfer tool configured to transfer a first set of singulated first die structures and a second set of singulated second die structures to the transfer substrate, wherein each singulated first die structure includes a first die of the plurality of first dies and a first portion of the first thickness layer, and each singulated second die structure includes a second die of the plurality of second dies and a second portion of the second thickness layer.

2. The apparatus of claim 1, further comprising:

a singulation tool configured to singulate:

the first die substrate, the first thickness layer, and a first support substrate into the singulated first die structures that further include first portions of the first support substrate, and the second die substrate, the second thickness layer, and a second support substrate into the singulated second die structures that further include second portions of the second support substrate.

3. The apparatus of claim 2, wherein the die transfer tool is further configured to:

transfer the first set of the singulated first die structures to the transfer substrate such that the first portions of the first support substrate contact the transfer substrate, and transfer the second set of the singulated second die structures to the transfer substrate such that the second portions of the second support substrate contact the transfer substrate.

4. The apparatus of claim 2, further comprising:

a controller configured to:

determine an amount of the first thickness layer to supply based at least in part on a thickness of the first die substrate, a thickness of the first support substrate, and a thickness of the singulated second die structures, wherein the first die substrate is a thinned first die substrate having a nonuniform thickness; and transmit a signal to the dispense module to supply the amount of the first thickness layer.

5. The apparatus of claim 4, wherein the dispense module is configured to supply the first thickness layer at a greater areal density at a first location of the first die substrate where the first die substrate is relatively thinner and at a lower areal density at a second location of the first die substrate where the first die substrate is relatively thicker.

6. The apparatus of claim 1, further comprising:

a controller configured to:

transmit a first signal to the dispense module to apply the first thickness layer over the plurality of first dies;

transmit a second signal to a singulation tool to singulate the first die substrate into the singulated first die structures;

transmit a third signal to the dispense module to apply the second thickness layer over the plurality of second dies; and transmit a fourth signal to the singulation tool to singulate the second die substrate into the singulated second die structures.

7. The apparatus of claim 1, further comprising:

a destination substrate chuck for holding a destination substrate;

a substrate transfer tool configured to invert and position the transfer substrate over the destination substrate chuck; and a bonding head configured to bond the first set of the singulated first die structures and the second set of the singulated second die structures of the transfer substrate to third dies of the destination substrate.

8. The apparatus of claim 7, wherein the substrate transfer tool is further configured to move the bonding head over the destination substrate chuck.

9. An apparatus, comprising:

a first die substrate chuck for holding a first die substrate including a plurality of first dies, wherein the first die substrate has a first nonuniform thickness, a device side, and a back side opposite the device side;

a second die substrate chuck for holding a second die substrate including a plurality of second dies, wherein the second die substrate has a second nonuniform thickness, a device side, and a back side opposite the device side;

a dispense module configured to supply a first thickness layer onto the back side of the first die substrate and a second thickness layer onto the back side of the second die substrate;

a singulation tool configured to singulate:

the first die substrate and the first thickness layer into singulated first die structures that include first portions of the first thickness layer, and the second die substrate and the second thickness layer into singulated second die structures that include second dies and second portions of the second thickness layer;

a transfer substrate chuck for holding a transfer substrate; and a die transfer tool configured to transfer:

a first set of the singulated first die structures from the first die substrate chuck to the transfer substrate; and a second set of the singulated second die structures from the second die substrate chuck to the transfer substrate.

10. A method, comprising:

applying a first thickness layer over a first die substrate that includes a plurality of first dies, wherein the plurality of first dies has a nonuniform thickness, and applying the first thickness layer is performed using an apparatus comprising:

a first die substrate chuck for holding the first die substrate including the plurality of first dies, wherein the first die substrate is a first thinned substrate having a first nonuniform thickness, a device side, and a back side opposite the device side;

a second die substrate chuck for holding a second die substrate including a plurality of second dies, wherein the second die substrate is a second thinned substrate having a second nonuniform thickness, a device side, and a back side opposite the device side, and the first die substrate has a different average thickness as compared to the second die substrate;

a dispense module configured to supply:

the first thickness layer onto the back side of the first die substrate to compensate for the first nonuniform thickness of the first die substrate, and a second thickness layer onto the back side of the second die substrate to compensate for the second nonuniform thickness of the second die substrate;

a transfer substrate chuck for holding a transfer substrate; and a die transfer tool configured to transfer a first set of singulated first die structures and a second set of singulated second die structures to the transfer substrate, wherein each singulated first die structure includes a first die of the plurality of first dies and a first portion of the first thickness layer, and each singulated second die structure includes a second die of the plurality of second dies and a second portion of the second thickness layer;

singulating the first die substrate and the first thickness layer to form the singulated first die structures;

singulating the second die substrate and the second thickness layer to form the singulated second die structures;

attaching a particular first die structure of the singulated first die structures to the transfer substrate, wherein the particular first die structure includes a particular first die; and the transfer substrate includes a particular second die structure of the singulated second die structures, wherein the particular second die structure includes a particular second die, and the particular second die has an average thickness different as compared to the particular first die; and bonding the particular first die structure and the particular second die structure to a particular third die, wherein:

each of the particular first die structure and the particular second die structure has a proximal surface and a distal surface opposite the proximal surface, wherein the proximal surface is disposed between the particular third die and the distal surface, after bonding, the distal surface of the particular first die structure and the distal surface of the particular second die structure are within a tolerance of being coplanar.

11. The method of claim 10, wherein, after bonding:

the distal surface of the particular first die structure lies along a first plane, the distal surface of the particular second die structure lies along a second plane, and the first plane is parallel to the second plane, or the first plane intersects the second plane at an acute angle of at most 1 milliradian.

12. The method of claim 10, wherein, after bonding:

the distal surface of the particular first die structure lies at a first average elevation above the particular third die, the distal surface of the particular second die structure lies at a second average elevation above the particular third die, and the first average elevation is within 1 micron of the second average elevation.

13. The method of claim 10, further comprising:

(1) inverting the transfer substrate before bonding; or (2) inverting a third die substrate before bonding, wherein the third die substrate is associated with the particular third die.

14. The method of claim 10, further comprising:

attaching a first support substrate to the first thickness layer to form a first sandwich structure that includes the first die substrate, the first thickness layer, and the first support substrate; and attaching a second support substrate to the second thickness layer to form a second sandwich structure that includes the second die substrate, the second thickness layer, and the second support substrate, wherein:

singulating the first die substrate and the first thickness layer includes singulating the first sandwich structure to form the singulated first die structures, and singulating the second die substrate and the second thickness layer includes singulating the second sandwich structure to form the singulated second die structures.

15. The method of claim 14, wherein the particular first die is thinner as compared to the particular second die, and the first support substrate is thicker as compared to the second support substrate.

16. The method of claim 14, wherein, after bonding, the method further comprises:

for the particular first die structure, removing the first thickness layer and the first support substrate from the particular first die; and for the particular second die structure, removing the second thickness layer and the second support substrate from the particular second die.

17. The method of claim 14, further comprising:

transmitting actinic radiation through the first support substrate to cure the first thickness layer; and transmitting the actinic radiation through the second support substrate to cure the second thickness layer.

18. The method of claim 10, wherein a third die substrate includes a plurality of third dies, including the particular third die, wherein the plurality of third dies is part of or attached to the third die substrate.

19. The method of claim 18, wherein the third die substrate includes a set of third dies, including the particular third die, that are known good dies, wherein the set of third dies has a same number of or fewer dies as compared to the plurality of third dies.

20. The method of claim 19, wherein:

the plurality of first dies includes a set of first dies that are known good first dies bonded to the set of third dies, the plurality of second dies includes a set of second dies that are known good second dies bonded to the set of third dies, wherein the set of second dies includes the second particular die, and the set of first dies, the set of second dies, and a set of third dies have the same number of dies.

21. The method of claim 18, further comprising:

bonding a bad first die of the singulated first die structures to a bad third die of the plurality of third dies.

* * * * *